United States Patent
Fujii et al.

(10) Patent No.: US 10,684,785 B2
(45) Date of Patent: Jun. 16, 2020

(54) STORAGE SYSTEM

(71) Applicant: HITACHI, LTD., Tokyo (JP)

(72) Inventors: Yoshihiko Fujii, Tokyo (JP); Shigeo Homma, Tokyo (JP); Junji Ogawa, Tokyo (JP); Yoshinori Ohira, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/330,881

(22) PCT Filed: Feb. 23, 2017

(86) PCT No.: PCT/JP2017/006734
§ 371 (c)(1),
(2) Date: Mar. 6, 2019

(87) PCT Pub. No.: WO2018/154669
PCT Pub. Date: Aug. 30, 2018

(65) Prior Publication Data
US 2019/0205054 A1    Jul. 4, 2019

(51) Int. Cl.
*G06F 12/00* (2006.01)
*G06F 3/06* (2006.01)
(Continued)

(52) U.S. Cl.
CPC .............. *G06F 3/0634* (2013.01); *G06F 3/06* (2013.01); *G06F 3/064* (2013.01); *G06F 3/0616* (2013.01); *G06F 3/0688* (2013.01); *G06F 12/00* (2013.01); *G06F 12/02* (2013.01); *G06F 12/16* (2013.01); *G11C 16/3495* (2013.01);
(Continued)

(58) Field of Classification Search
None
See application file for complete search history.

(56) References Cited

U.S. PATENT DOCUMENTS

| | | |
|---|---|---|
| 5,844,841 A | 12/1998 | Takeuchi et al. |
| 6,075,723 A | 6/2000 | Naiki et al. |

(Continued)

FOREIGN PATENT DOCUMENTS

| | | |
|---|---|---|
| JP | 09-288896 A | 11/1997 |
| JP | 11-176178 A | 7/1999 |
| JP | 2011-186553 A | 9/2011 |

OTHER PUBLICATIONS

International Search Report for PCT/JP2017/006734, dated Apr. 4, 2017.

*Primary Examiner* — John A Lane
(74) *Attorney, Agent, or Firm* — Volpe and Koenig, P.C.

(57) ABSTRACT

A storage system according to one aspect of the present invention includes a plurality of storage devices using flash memory as a storage medium. The flash memory used for the storage device may include flash memory configured to operate each cell as a cell capable of storing n-bit information or a cell capable of storing m-bit information (where n<m). The storage system may periodically acquire a number of remaining erasures from the storage device and predict the lifetime of the storage device by using the acquired number of remaining erasures and the storage device operation time. If the predicted lifetime is less than a predetermined value (service life) a predetermined number of cells may be changed to cells capable of storing n-bit information.

13 Claims, 22 Drawing Sheets

(51) Int. Cl.
  *G11C 16/34* (2006.01)
  *G06F 12/02* (2006.01)
  *G06F 12/16* (2006.01)
  *G11C 11/56* (2006.01)

(52) U.S. Cl.
  CPC ... *G11C 11/5621* (2013.01); *G11C 2211/5641* (2013.01); *G11C 2211/5644* (2013.01)

(56) References Cited

U.S. PATENT DOCUMENTS

| | | | |
|---|---|---|---|
| 8,335,886 B2 * | 12/2012 | Lee | G06F 12/0246 365/185.29 |
| 2008/0250220 A1 | 10/2008 | Ito | |
| 2012/0191900 A1 | 7/2012 | Kunimatsu et al. | |
| 2014/0293692 A1 * | 10/2014 | Chen | G11C 16/06 365/185.11 |
| 2018/0203631 A1 * | 7/2018 | Doi | G06F 3/0688 |

* cited by examiner

Fig. 3

Mode:
0: MLC
1: TLC

| Chip # 1151 | Die # 1152 | Block # 1153 | Mode 1154 | Number of Remaining Erasures 1155 | Number of Written Pages 1156 | Number of Invalid Pages 1157 | Block State 1158 |
|---|---|---|---|---|---|---|---|
| 0 | 0 | 0 | 0 | 3000 | 128 | 128 | Invalid |
| 0 | 0 | 1 | 0 | 4532 | Unwritten | 0 | Erased |
| 0 | 0 | 2 | 1 | 2123 | ... | ... | ... |
| ... | ... | ... | ... | ... | ... | ... | ... |
| 2 | 1 | 0 | 1 | ... | ... | ... | ... |
| 2 | 1 | 1 | 0 | 1000 | 128 | 121 | Valid |
| ... | ... | ... | ... | ... | ... | ... | ... |

Block Management Table 1150

Fig. 6

| RG# | RAID Level | Drive Number | Logical Capacity | Number of Remaining Erasures (Previous) | Start Date | Difference Ratio 657 | | | | Predicted Lifetime Value (Previous) | T.Cell | Last Execution Date |
|---|---|---|---|---|---|---|---|---|---|---|---|---|
| 651 | 652 | 653 | | 654 | 656 | D0 657-0 | D1 657-1 | D2 657-2 | D3 657-3 | 658 | 659 | 660 |
| 1 | RAID5 | SSD#0 | 1PB | 1000000 | 2015/2/22 | 0.9 | 0.9 | 1.2 | 1.2 | 2022/12/10 | | |
|   |       | SSD#1 | 1PB | 9400000 | 2015/2/22 | 0.4 | 0.4 | 0.5 | 0.5 | ... | 1 | |
|   |       | SSD#2 | 1PB |         | 2015/2/22 | 0.8 | 0.8 | 1.2 | 1.2 | ... | | |
|   |       | SSD#3 | 1PB |         | 2015/2/22 | 0.2 | 0.2 | 0.4 | 0.4 | ... | | |
| 2 | RAID5 | SSD#4 | 6PB |         |           | ... | ... | ... | ... | ... | 0 | |
|   |       | SSD#5 | 6PB |         |           | ... | ... | ... | ... | ... | | |
|   |       | SSD#6 | 6PB |         |           | ... | ... | ... | ... | ... | | |
|   |       | SSD#7 | 6PB |         |           |     |     |     |     |     | | |
| ... |     | ...   |     |         |           |     |     |     |     |     | | |
| N |       |       |     |         |           |     |     |     |     |     | | |

Raid Group Management Table 650

Fig. 14

T. Cell Execution Verification
Based on the current usage state, the SSD will reach the end of its life in xx years. By enabling T. Cell functionality, it is possible to satisfy the warranty period and extend the current capacity of zzTB to aaTB. Would you like to enable T. Cell functionality?

Execute

Do Not Execute

Fig. 20

| RG# 651 | RAID Level 652 | Drive Number 653 | Logical Capacity 654 | Physical Capacity 661 | Compression Rate 662 | Total Write Amount 663 | Random Write Ratio 664 | Total Erasure Count 665 | WAF 666 |
|---|---|---|---|---|---|---|---|---|---|
| 1 | RAID5 | SSD#0 | 1PB | 1.5PB | 1 | 218PB | 1 | 4532 | - |
| | | SSD#1 | 1PB | 1.5PB | 1 | 320PB | 1 | 4315 | - |
| | | SSD#2 | 1PB | 1.5PB | 1 | 200PB | 1 | 4530 | - |
| | | SSD#3 | 1PB | 1.5PB | 1 | 242PB | 1 | 4532 | - |
| 2 | RAID5 | SSD#4 | 6PB | 8PB | 1 | - | - | - | - |
| | | SSD#5 | 6PB | 8PB | 1 | - | - | - | - |
| | | SSD#6 | 6PB | 8PB | 1 | - | - | - | - |
| | | SSD#7 | 6PB | 8PB | 1 | - | - | - | - |
| ⋮ | | ⋮ | ⋮ | | | | | | |
| N | | | | | | | | | |

RAID Group Management Table 650'

STORAGE SYSTEM

TECHNICAL FIELD

The present invention relates to a storage system using nonvolatile semiconductor memory.

BACKGROUND ART

In comparison to magnetic storage devices, nonvolatile semiconductor memory has higher power consumption and higher performance, and is also more expensive. Nonvolatile semiconductor memory may, for example, include NAND type flash memory. In recent years, together with the advances in semiconductor technology, the cost of nonvolatile semiconductor memory is decreasing, and it has been drawing attention as a mainstream storage device to replace hard disk drives (HDDs).

Flash memory may include a plurality of memory cells (hereinafter abbreviated as "cells") for storing data. In addition to cells capable of storing 1-bit information (referred to as SLC), there are also cells capable of storing information of 2-bits or more (referred to as MLC; in addition, cells capable of storing information of 3-bits or more may be referred to as TLC). When MLC-type cells are used in flash memory, the bit cost can be reduced in comparison with cases that use SLC-type cells. Further, by utilizing cells capable of storing information of 3-bits or more (TLC) among MLC-type cells, it is possible to further reduce the bit cost in comparison with using cells capable of storing 2-bit information.

Also, in recent years, techniques have been proposed that make it possible to change the amount of information (number of bits) that can be stored in a cell. For example, Patent Document 1 discloses memory that can set a particular area to operate in a mode, in which 1 bit of data can be written in one memory cell transistor, and set another area to operate in a mode in which multiple bits of data can be written.

CITATION LIST

Patent Literature

[PTL 1] U.S. Patent Application Publication No. 2008/0250220

SUMMARY OF INVENTION

Technical Problem

However, the more information (the number of bits) is stored in cells, the more its lifetime (service life) tends to be shortened. Accordingly, it is necessary to use different approaches depending on the situation; for instance, when reliability and durability are prioritized, cells with a small number of storable bits (SLC or MLC) can be used, and when cost (price) is prioritized, cells with a large number of storable bits (TLC) can be used.

When using the technique disclosed in Patent Document 1 in which a cell with a small number of storage bits and a cell with a large number of storable bits are used in combination, it is possible to realize a storage device with a better balance between cost and durability than that of conventional flash memory. However, as the lifetime of flash memory (cells) fluctuates depending on the erasure frequency, it is difficult to predetermine the combination ratio of cells having a small number of storable bits and cells having a large number of storable bits.

When the erasure frequency is low, the flash memory can support long-term use. However, the erasure frequency largely depends on the operating state (access frequency) of the storage system. As such, even if the storage device is configured to include a large number of cells with a large number of storable bits, the access frequency may be higher than initially assumed. In such a case, there is a possibility that the storage device may become unusable before the predicted life expectancy (service life) of the storage device elapses.

Conversely, even if the storage device is configured to include a large number of cells having a small number of storage bits, there are cases where the access frequency is lower than initially assumed. In such a case, although the lifetime of the storage device may be extended, since the storage capacity is small, this may lead to an increase in the cost of the storage system.

Accordingly, there is demand for a technique capable of appropriately modifying the combination ratio of cells having a small number of storable bits and cells having a large number of storage bits in accordance with the operating state of the storage system.

Solution to Problem

A storage system according to one aspect of the present invention includes a plurality of storage devices using flash memory as a storage medium. In addition, the flash memory used for the storage device may be a type of flash memory that can operate each cell as either a cell capable of storing n-bit information or a cell capable of storing m-bit information ($n<m$).

The storage system may periodically collect the number of remaining erasures from the storage device, and predict the lifetime of the storage device by using the acquired number of remaining erasures and the storage device operating time. When the predicted lifetime is less than a predetermined value (service life), a target number of remaining erasures, which is the number of remaining erasures of the storage device that satisfies a predetermined lifetime, is calculated, and a number of cells (blocks) that are necessary for the number of remaining erasures of the storage device to achieve the target number of remaining erasures are changed from among those cells (blocks) that are capable of storing m-bit information to cells (blocks) capable of storing n-bit information

Advantageous Effects of Invention

According to the present invention, it is possible to realize a storage system that can achieve both high storage capacity and high durability.

BRIEF DESCRIPTION OF DRAWINGS

FIG. 3 is a diagram for explaining a configuration of a block management table.

FIG. 6 is a diagram for explaining a configuration of a RAID group management table.

FIG. 14 is an example of a verification screen.

FIG. 20 is a diagram for explaining a configuration of a RAID group management table according to Embodiment 3.

DESCRIPTION OF EMBODIMENT(S)

Herein, several embodiments will be described below. In the following embodiments, it is assumed that the nonvolatile semiconductor storage medium used for the storage device is a flash memory (FM). Further, it is assumed that the flash memory is a flash memory of a type in which reads/writes are performed on a page-unit basis, typically a NAND-type flash memory. However, another type of flash memory may be used in place of the NAND-type flash memory. In addition, another type of nonvolatile semiconductor storage medium, such as a phase-change memory for example, may be utilized instead of the flash memory.

Embodiment 1

Figure 1:
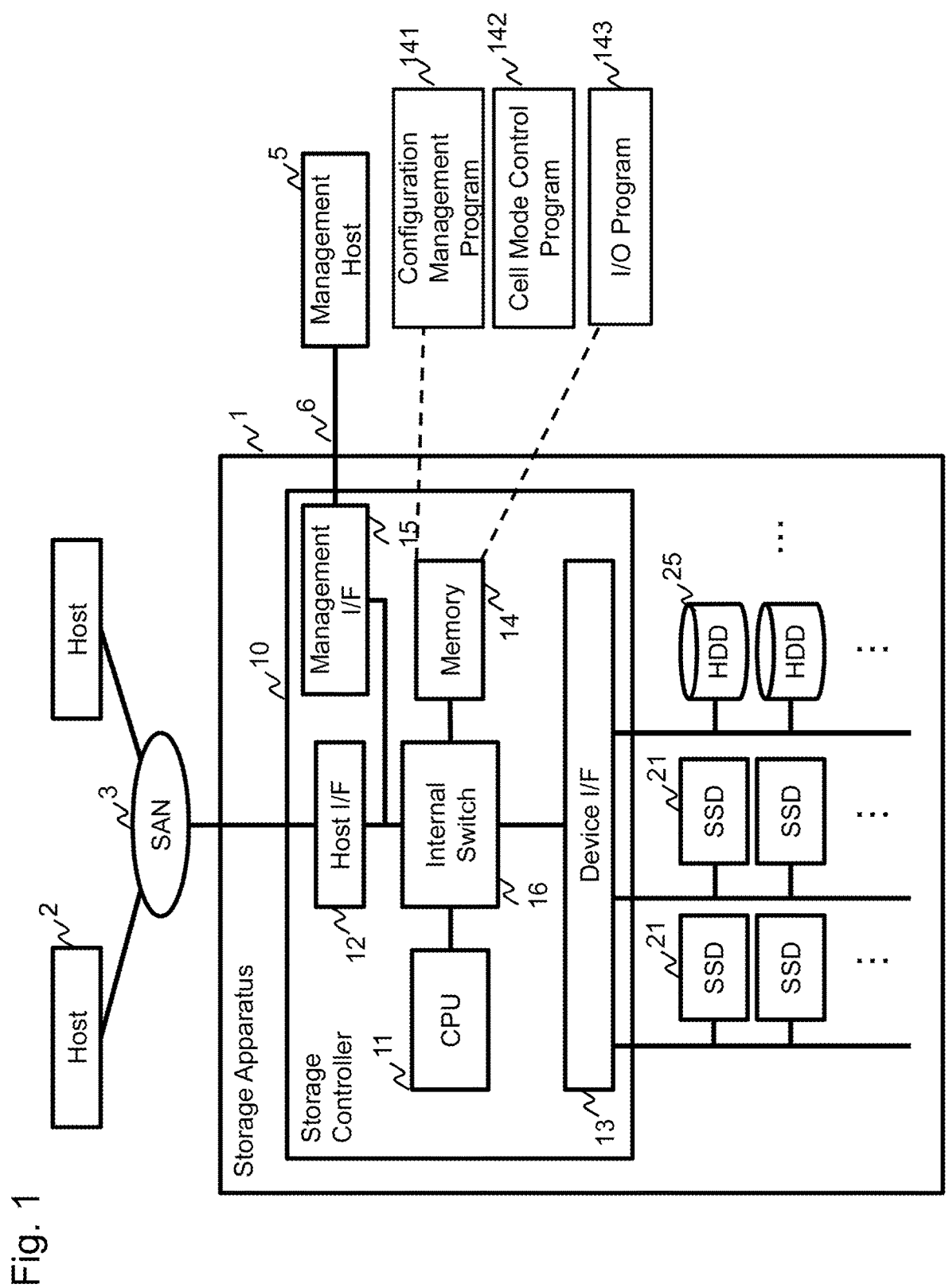
FIG. 1 is a diagram illustrating a configuration example of a storage system according to Embodiment 1.

Hereinafter, the configuration and operation of the storage apparatus 1 according to Embodiment 1 will be described in detail. FIG. 1 is a diagram illustrating a configuration example of a computer system including a storage system 1 (also referred to herein as "storage apparatus 1").

The storage apparatus 1 may include a storage controller 10 and a plurality of storage devices (SSD 21, HDD 25) connected to the storage controller 10.

The SSD 21 is a storage device for storing write data from an external device such as a host (host computer) 2, and is a storage device that employs a nonvolatile semiconductor memory such as flash memory as a storage medium. The internal configuration of the SSD 21 will be described later. As an example, the SSD 21 may be connected to the storage controller 10 by a transmission line (SAS link) according to the SAS (Serial Attached SCSI) standard, a transmission line (PCI link) according to the PCI (Peripheral Component Interconnect) standard or the like.

Further, as depicted in FIG. 1, in addition to the SSD 21, a HDD (Hard Disk Drive) 25 can also be used as the storage device of the storage apparatus 1 of this embodiment. The HDD 25 may be a storage device that uses a magnetic disk as a storage medium. Similar to the SSD 21, the HDD 25 may also be connected to the storage controller 10. Also similar to the SSD 21, the HDD 25 may be connected to the storage controller 10 via a SAS link or the like. However, in the following, the description will focus on a configuration in which only the SSD 21 is connected as a storage device to the storage apparatus 1 of the present embodiment.

The storage controller 10 may be a component configured to receive a data access request from the host 2 and perform processing (read processing and write processing) on the SSD 21 and HDD 25 in accordance with the received access request. Hereinafter, the storage controller 10 may be abbreviated as DKC 10 in some cases. One or more hosts 2 may be connected to the storage controller 10. Also, the storage controller 10 may be connected to a management host 5. The storage controller 10 and the host 2 may be connected via a SAN (Storage Area Network) 3 structured using a fiber channel, as an example. The storage controller 10 and the management host 5 may be connected via a LAN (Local Area Network) 6 structured using Ethernet, as an example.

The storage controller 10 may include at least a processor (CPU) 11, a host interface (denoted as "host I/F" in the FIG. 12), a device interface (denoted as "device I/F" in the FIG. 13), a memory 14, and a management I/F 15. The processor 11, the host I/F 12, the device I/F 13, the memory 14, and the management I/F 15 may be interconnected via an internal switch (internal SW) 16. Although only one of each of these constituent elements are depicted in FIG. 1, a plurality of each of these components may be mounted in the storage controller 10 in order to achieve high performance and high availability. In addition, each component may be interconnected via a shared bus in place of the internal SW 16.

The device I/F 13 may include at least an interface controller and a transfer circuit (not shown). The interface controller may be a component configured to convert the protocols (for example, SAS) used by the SSD 21 into communication protocols (for example, PCI-Express) used within the storage controller 10. The transfer circuit may be used when the storage controller 10 performs data transfer (reads, writes) to the SSD 21.

Similarly to the device I/F 13, the host I/F 12 may include at least an interface controller and a transfer circuit (not shown). The interface controller of the host I/F 12 may be configured to convert the communication protocols (for example, fiber channel) used in the data transfer path between the host 2 and the storage controller 10 as well as the communication protocols used within the storage controller 10.

The processor 11 may perform various controls of the storage apparatus 1. The memory 14 may be used to store programs executed by the processor 11 and various management information of the storage apparatus 1 used by the processor 11. For example, the configuration management program 141, the cell mode control program 142, and the I/O program 143 may be stored in the memory 14. A detailed description of these programs will be provided later. In addition, the memory 14 may also be used for temporarily storing I/O target data for the SSD 21. Hereinafter, the storage area of the memory 14 used for temporarily storing the I/O target data for the SSD 21 may be referred to as a "cache." The memory 14 may be structured using a volatile storage medium such as DRAM, SRAM, or the like, but as another embodiment, the memory 14 may be structured using nonvolatile memory.

The management host 5 may be a computer for performing management operations for the storage apparatus 1. The management host 5 may include input/output devices (not shown) such as a keyboard and a display, and a user (administrator) can issue configuration instructions to the storage apparatus 1 using the input/output devices. In addition, the management host 5 can display information such as the state of the storage apparatus 1 on an output device such as a display.

Figure 2:
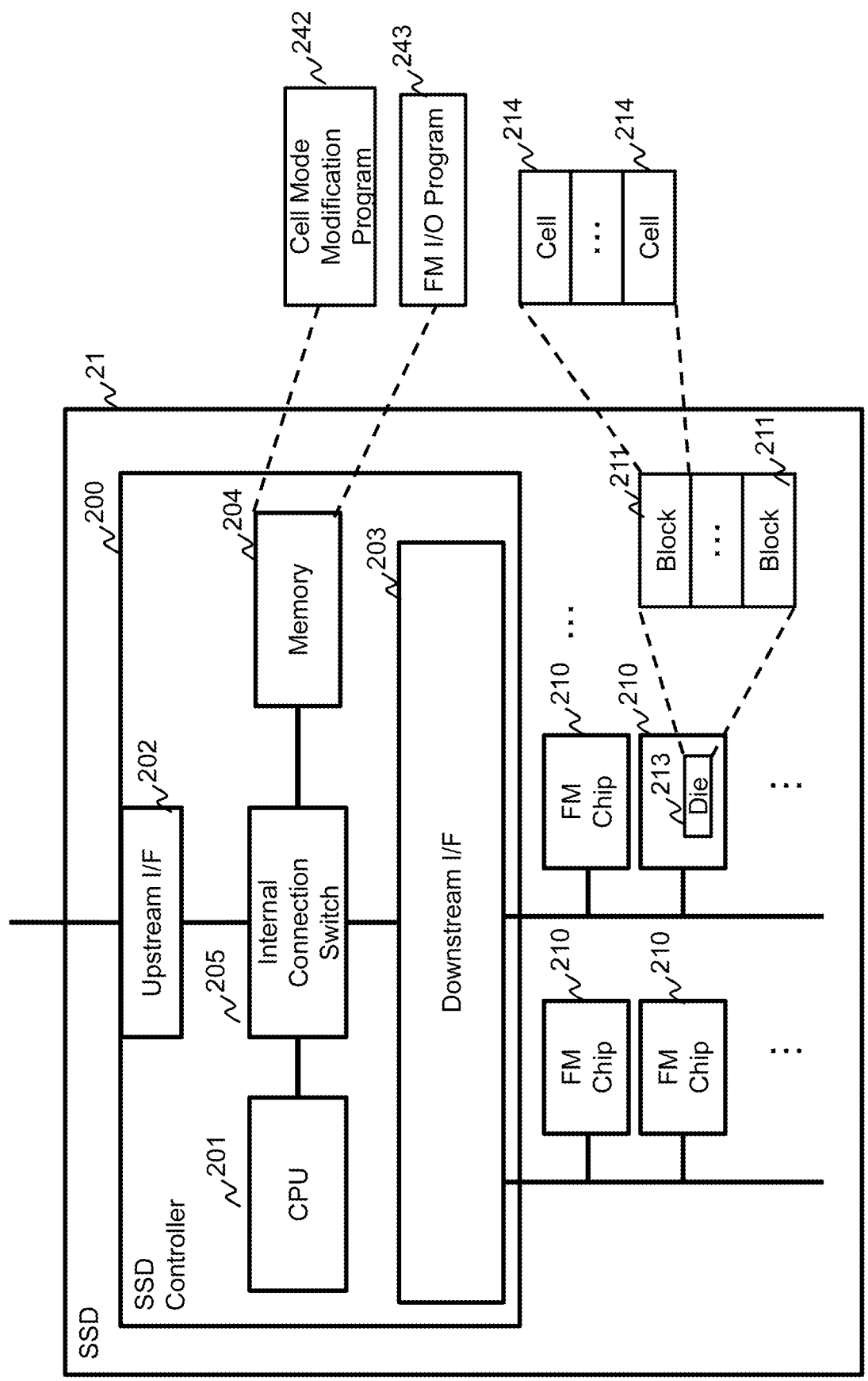
FIG. 2 is a diagram illustrating a configuration example of an SSD.

FIG. 2 is a diagram illustrating a configuration example of the SSD 21. It should be noted that it may be sufficient for the SSD 21 to be a storage device including a plurality of flash memories and a controller for controlling them, and the form factor and the like need not correspond to existing HDDs.

The SSD 21 may include an SSD controller 200 and a plurality of FM chips 210. The SSD controller 200 may include a processor (CPU) 201, an upstream I/F 202, a downstream I/F 203, and a memory 204. These components may be interconnected via an internal connection switch (internal connection SW) 205.

The upstream I/F 202 may be an interface controller for performing communication between the SSD 21 and the storage controller 10. The upstream I/F 202 may be connected to the device I/F 13 of the storage controller 10 via a transmission line (SAS link or PCI link). Similarly, the downstream I/F 203 may be an interface controller for performing communication between the SSD controller 200 and the FM chip 210.

The CPU 201 may be configured to perform processing and other operations relating to various commands received from the storage controller 10. The memory 204 may store programs executed by the CPU 201 and various management information. For example, a cell mode modification program 242 and an FM I/O program 243 may be stored in the memory 204. A detailed description of these programs will be provided later. A portion of the areas of the memory 204 may be used as a buffer for temporarily storing write data transmitted together with write commands from the storage controller 10 and the data read from the FM chip 210. A volatile memory such as DRAM may be used as the memory 204. However, a nonvolatile memory may also be used for the memory 204.

The FM chip 210 may include a nonvolatile semiconductor memory chip such as a NAND-type flash memory, for example. The FM chip 210 may include a plurality of dies 213, and each die 213 may include a plurality of cells 214. The cells 214 may include storage elements structured from transistors or the like, and each cell 214 can retain one or more bits of data. The write data from the SSD controller 200 may be stored in the cells 214. In addition, in the cells 214 of the FM chip 210 of the present embodiment, the amount of information (number of bits) storable in the cells 214 can be changed based on an instruction from the SSD controller 200. As is well known, reading and writing of data in the flash memory cannot be performed for the cells 214 on a cell-unit basis. Rather, reading and writing of a set of a plurality of cells 214 is performed at once for each area of a predetermined size called a page (for example, 8 KB). Also, data erasure is performed at once for each block 211, which is a set of pages.

The SSD 21 according to the present embodiment manages each FM chip 210 by assigning a unique identification number, called a chip number (chip #), thereto. Also, each die 213 in the FM chip 210 may be assigned a unique identification number, called a die #, within the FM chip 210. Further, each block 211 in the die 213 may be assigned a unique identification number, called a block #, within the die 213. When the SSD controller 200 accesses the block 211 of the FM chip 210, the block 211 in the SSD 21 is uniquely specified by designating the chip #, the die #, and the block #.

In contrast, the storage address space (referred to as a logical address space or a LBA space) that the SSD 21 (the SSD controller 200) of the present embodiment provides to the initiator such as the DKC 10 or the like is a space independent of the chip #, die #, and block #. As such, when the DKC 10 issues an access request (read command or write command) to the SSD 21, it is not necessary to designate the FM chip 210, the block 211, or the like. In the area on the LBA space, an address is assigned for each predetermined size (for example, 512 bytes), and this address is called a logical block address (LBA). The DKC 10 can read data from the SSD 21 or write data to the SSD 21 by issuing a command in which an area on the logical address space (an area specified by the LBA and the size of the access target area) is specified. When a write command for an area on the LBA space arrives from the DKC 10, the SSD controller 200 may allocate pages to that area. The write data may be stored in (the cells 214 within) the assigned pages. When a write request arrives for an area on the LBA space to which pages have already been allocated (that is, an overwrite request) the SSD controller 200 may allocate a new unused page (a page in which data has not yet been stored), and store the write data in the newly allocated unused page.

The SSD controller 200 may include management information (mapping tables) for managing the relationship (mapping) between the areas on the LBA space and the pages allocated to the areas on the LBA space. As this is similar to the information possessed by existing flash memories, the description thereof is omitted in this specification. It should be noted that, in the following description, pages associated with the LBA in the mapping table are referred to as "valid pages," and pages not associated with the LBA in the mapping table are referred to as "invalid pages."

As described herein, the number of bits storable in the cells 214 is variable. In the present embodiment, it is assumed that each cell 214 can be operated in either a mode capable of storing n-bit data or a mode capable for storing m-bit data (where n<m). In the following description, unless otherwise specified, cases of n=2 and m=3 will be described. In addition, the mode in which a cell 214 is capable of storing n-bit data (2 bits) is called an MLC (Multi-Level Cell) mode, and the mode in which a cell 214 is capable of storing m-bit data (3 bits) is called a TLC (Triple-Level Cell) mode. Also, the MLC mode and the TLC mode are generally referred to as "cell modes," or "modes."

In the present embodiment, it is assumed that all the cells 214 are set to the MLC mode in the initial state of each SSD 21 (immediately after initial use). At a time after initial use, the storage controller 10 may change the mode (change from the MLC mode to the TLC mode) of several cells 214 in the SSD 21 based on the operation status of the SSD 21.

In addition, it is assumed that modification of the cell mode is performed in units of blocks 211. That is, all of the cells 214 included in one block are set to the same mode. In this way, when the SSD controller 200 instructs the FM chip 210 to change the cell mode for a particular block in the FM chip 210, all the cells 214 in the block 211 are changed to the TLC mode. In the following description, when all the cells 214 in the block 211 are set to the MLC mode, the expression "the block is in MLC mode" may be used. Similarly, when all the cells 214 in the block 211 are set to TLC mode, the expression "the block is in TLC mode" may be used. However, the mode does not necessarily have to be changed for each block 211. As another embodiment, a mode change may be made for each die 213, or, alternatively, a mode change may be made for each page or for each cell 214.

The SSD 21 according to the present embodiment may be configured to change the size of the LBA space provided to the DKC 10. The size of the LBA space provided to the DKC 10 may be called a "logical capacity." In the SSD 21 according to the present embodiment, the logical capacity may be equal to the total storage capacity of all the cells 214 in the SSD 21. For example, when the number of cells 214 in the SSD 21 is N, and all the cells 214 are set to the MLC mode, the logical capacity of the SSD 21 may be N×2 (bits). Subsequently, when 10% of the cells 214 in the cells 214 within the SSD 21 are changed to the TLC mode, the logical capacity of the SSD 21 may be (0.1×N)×3+(0.9×N)×2=N× 2.1 (bits), such that the logical capacity may increase. However, as another embodiment, a portion of the cells 214 in the SSD 21 may be reserved as substitute cells (substitutes for cells 214 that cannot be used due to failure) and the total memory of the cells 214 excluding the substitute cells may be defined as the logical capacity.

The contents of the block management table 1150 managed by the SSD 21 will be described with reference to FIG. 3. The block management table 1150 may be stored in the memory 204. In each row (record) of the block management table 1150, information regarding each block 211 in the SSD 21 is stored. Among the columns of the block management table 1150, the chip #1151, the die #1152, and the block #1153 are columns for storing the chip #, the die #, and the block # of the block 211. By designating the chip #1151, the die #1152, and the block #1153, a block 211 in the SSD 21 may be uniquely specified.

The mode 1154 is a column for storing information indicating whether the block 211 is in the MLC mode or the TLC mode. When 0 is stored in the mode 1154, this indicates that the block 211 is in the MLC mode, and when 1 is stored in the mode 1154, this indicates that the block 211 is in the TLC mode. Information indicating the number of written pages of the block 211 is stored in the number of written pages 1156. In the present embodiment, a value, indicating "unwritten" is registered in the number of written pages 1156 for those blocks not written in the leading page. Information indicating the number of invalid pages in the block 211 is stored in the number of invalid pages 1157. In the present embodiment, 0 is set when the block is erased, and the number of invalid pages 1157 is incremented when the page in the block transitions to an invalid page. In block state 1158, information representing the state of the block 211 is stored. In the present embodiment, there are three types of stages of the block 221. More particularly, in the present embodiment, one of the following is indicated; a "valid block" state in which a valid page is included in the block, an "invalid block" state in which all the pages are invalid, or an "erased" state in which the data in the block has been erased. For example, data within a valid page included in a certain block is copied to a page of another block, and the association with the LBA of the mapping table is updated to the copy destination page. As a result of this processing, all the pages in the block become invalid pages, and the block is set as an invalid block. An invalid block is a block in which all the pages are invalid pages. An invalid block is a block to be subjected to an erasure process. It should be noted that the block state 1158 may be determined to be a "valid block" or an "invalid block" based on the information of the mapping table depending on the number of invalid pages among the blocks 211, specified by the block #1153.

In the number of remaining erasures 1155, information indicating how many times the block 211 may perform an erasure process is stored. There is a limit to the number of times a block 211 of the SSD 21 can be erased, such that when an erasure process is performed on the block 211 a predetermined number of times (referred to herein as a "number of possible erasures"), the block 211 can no longer be used. The number of possible erasures is a value determined by the vendor of the flash memory or the like, and in the case of MLC-type flash memory, it is reported to be about several ten thousand times. The number of remaining erasures is a value obtained by subtracting the number of times the erasure process has actually been performed on the block 211 (referred to as an erasure count) from the number of possible erasures of the block 211. As such, in an initial state (a state, in which the erasure process has never been performed), the number of remaining erasures is equal to the number of possible erasures.

As an example, in a case that the number of possible erasures of the block 211 is determined to be 30000 times, assume that the erasure process is performed 20000 times for a particular block 211. In this case, the number of remaining erasures of the block 211 is 10000 (30000−20000=10000).

In an initial state, the number of possible erasures (tens of thousands, for example) is stored in the number of remaining erasures 1155 for each block 211. It should be noted that the number of possible erasures of each block within the SSD 21 is equal. When the SSD controller 200 performs an erasure process of the block 211 one time, the SSD controller 200 subtracts 1 from the number of remaining erasures 1155 of the block 211. When the number of remaining erasures 1155 of the block 211 becomes 0, writing and erasing to the block 211 is prohibited.

Also, in the case of the TLC-type flash memory, the number of possible erasures is less than that of the MLC-type flash memory. As such, when the mode of the block 211 is modified while the flash memory is in use, the value of the number of remaining erasures 1155 is also changed. In the present embodiment, when the number of remaining erasures $1155n$ (where n is an integer of 0 or more) and a block 211 set in the MLC mode is changed to the TLC mode, the process in the following description will be made with the assumption that the number of remaining erasures 1155 of the block 211 will be changed to n/c. It should be noted that c is a value of 2 or more, and in the following description, a case where c=10 will be described unless otherwise specified. That is, when the mode of the block 211 is changed from the MLC mode to the TLC mode, the value of the number of remaining erasures 1155 of the block 211 may become one tenth of the value before prior to the mode change.

When assigning (pages in) a block 211 to the LBA space, the SSD 21 may select the block 211 having the largest number of remaining erasures 1155 by making reference to the number of remaining erasures 1155 in the block management table 1150, and allocate the pages in the block 211 to the LBA space. When a method of block 211 selection such as this is utilized, events are less likely to occur in which only the erasure count for a specific block 211 in the SSD 21 increases (the number of remaining erasures decreases). However, since imbalances may still occur in the number of remaining erasures of each block 211, the SSD 21 of the present embodiment may be configured to perform processing to make the number of remaining erasures of each block 211 as uniform as possible (what is known as a wear-leveling process), similar to existing flash memories. As wear-leveling is an existing process, an explanation thereof is omitted herein.

Next, the relationship between the volume (virtual volume) provided by the storage apparatus 1 of the present embodiment to the host 2, the RAID group, and the LBA space provided by the SSD 21 to the DKC 10 will be described with reference to FIG. 4 and FIG. 5. By utilizing RAID (Redundant Arrays of Inexpensive/Independent Disks) techniques, the storage apparatus 1 may structure one logical storage space from the plurality of SSDs 21. A set of SSDs 21 used to form one logical storage space by RAID techniques is called a RAID group.

In RAID techniques, when storing data in a RAID group, redundant information (parity) is generated using the data, and the data and parity are stored in different SSSDs 21 in the RAID group. Accordingly, when a failure occurs in one (or two) SSDs 21 in the RAID group and data access is no longer possible, the storage apparatus 1 can restore the data stored in the SSD 21 in which the failure occurred by using the data (and parity) in the remaining SSD 21.

Figure 4:
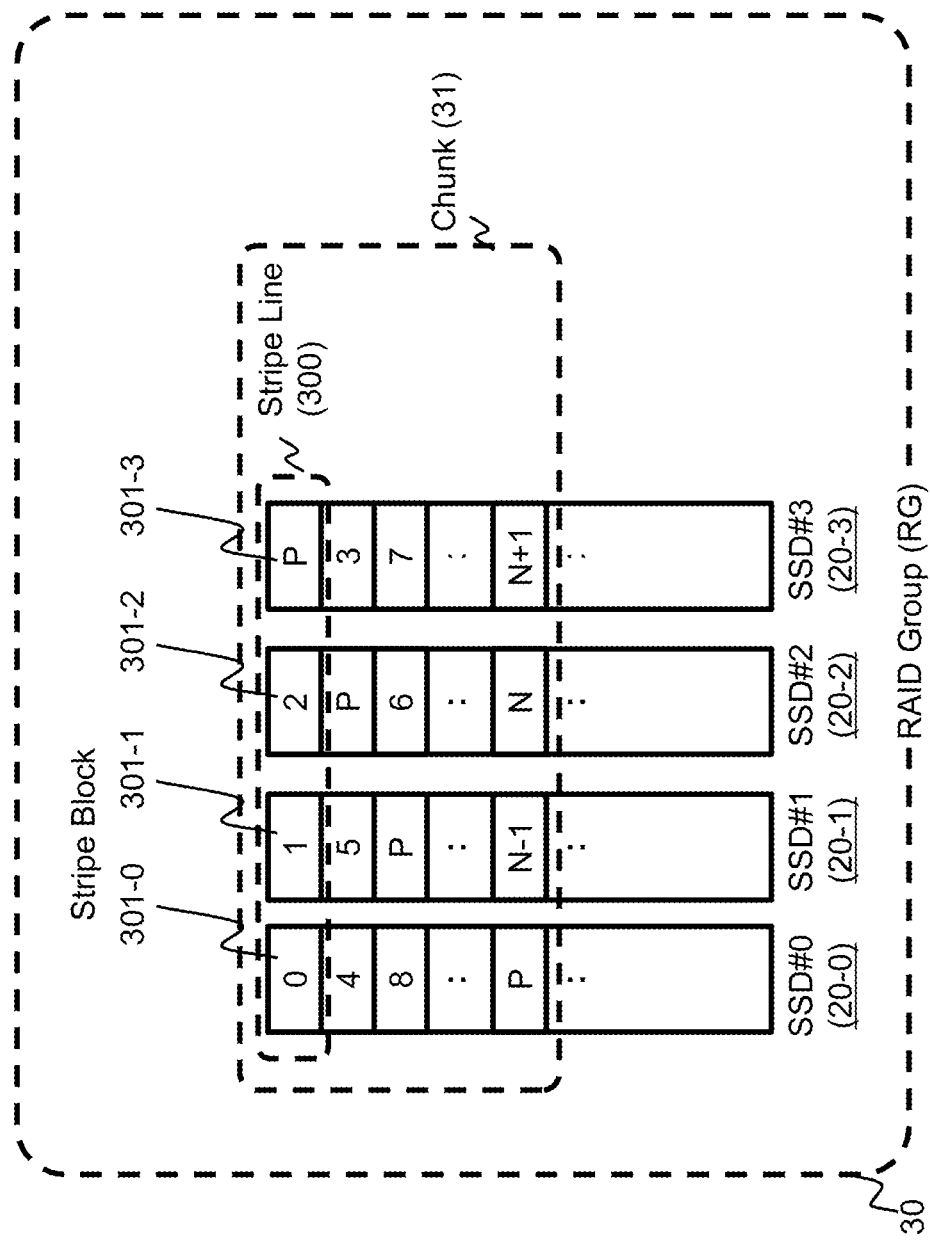
FIG. 4 is an explanatory diagram of a RAID group.

FIG. 4 is a conceptual diagram for explaining the storage space of the RAID group 30. In FIG. 4, an example is illustrated in which the RAID group 30 is composed of four SSDs 21. Also in FIG. 4, SSD #0 (20-0) to SSD #3 (20-3) represent the logical address spaces (LBA spaces) that the SSD 21 provides to the storage controller 10. The upper end of SSD #0 (20-0) to SSD #3 (20-3) represents the leading address (LBA=0) of the logical address space and the lower end is the end of the logical address space.

In addition, FIG. 4 illustrates an example in which the RAID level (which represents a data redundancy method in RAID technology, and generally includes RAID levels of RAID 1 to RAID 6) of the RAID group 30 is RAID 5. In FIG. 4, boxes such as "0," "1", and "P," in the RAID group 30 represent stripe blocks, and the size of the stripe blocks may, for example, be 64 KB, 256 KB, 512 KB, or the like. In addition, numbers such as the "1" attached to each stripe block may be referred to as "stripe block numbers."

In FIG. 4, the stripe block marked as "P" among the stripe blocks is a stripe block storing redundant data (parity), and is called a "parity stripe." In contrast, stripe blocks marked with numerals (0, 1, etc.) are stripe blocks in which data written from external devices such as the host 2 (data which is not redundant data) is stored. Such stripe blocks are called "data stripes."

The redundant data stored in the parity stripe is generated using the data in the data stripe. Hereinafter, a set of parity stripes and data stripes (for example, element 300 in FIG. 4) used for generating redundant data stored in the parity stripes is referred to as a "stripe line." In the case of the storage apparatus 1 of the present embodiment, similar to the stripe line 300 depicted in FIG. 4, stripe lines are formed according to the rule that each stripe block belonging to one stripe line exists at the same location (LEA) on SSD #0 (20-0) to SSD #3 (20-3).

Further, the storage controller 10 may be configured to manage a plurality of stripe lines arranged consecutively in the RAID group in management units called "chunks." As illustrated in FIG. 4, one chunk 31 may include a plurality of stripe lines. The size of each chunk may be the same. However, configurations in which one chunk 31 may only include one stripe line are also possible.

Each chunk may be assigned a unique identification number, called a chunk number, within the RAID group. The chunk number of the chunk including the leading stripe line (a stripe line composed of stripe blocks at the head of SSD # 0 (20-0) to SSD #3 (20-3)) of the RAID group may be set to 1, and consecutive integer values may be attached to each chunk positioned thereafter.

As described above, as each chunk is arranged in the RAID group in a regular fashion, addresses (address ranges) on the LBA space of the SSD 21 belonging to the chunk may be obtained from chunk numbers by a relatively simple calculation. Conversely, the chunk number of the chunk to which an address belongs can also be calculated from the address on the LBA space of the SSD 21.

Figure 5:
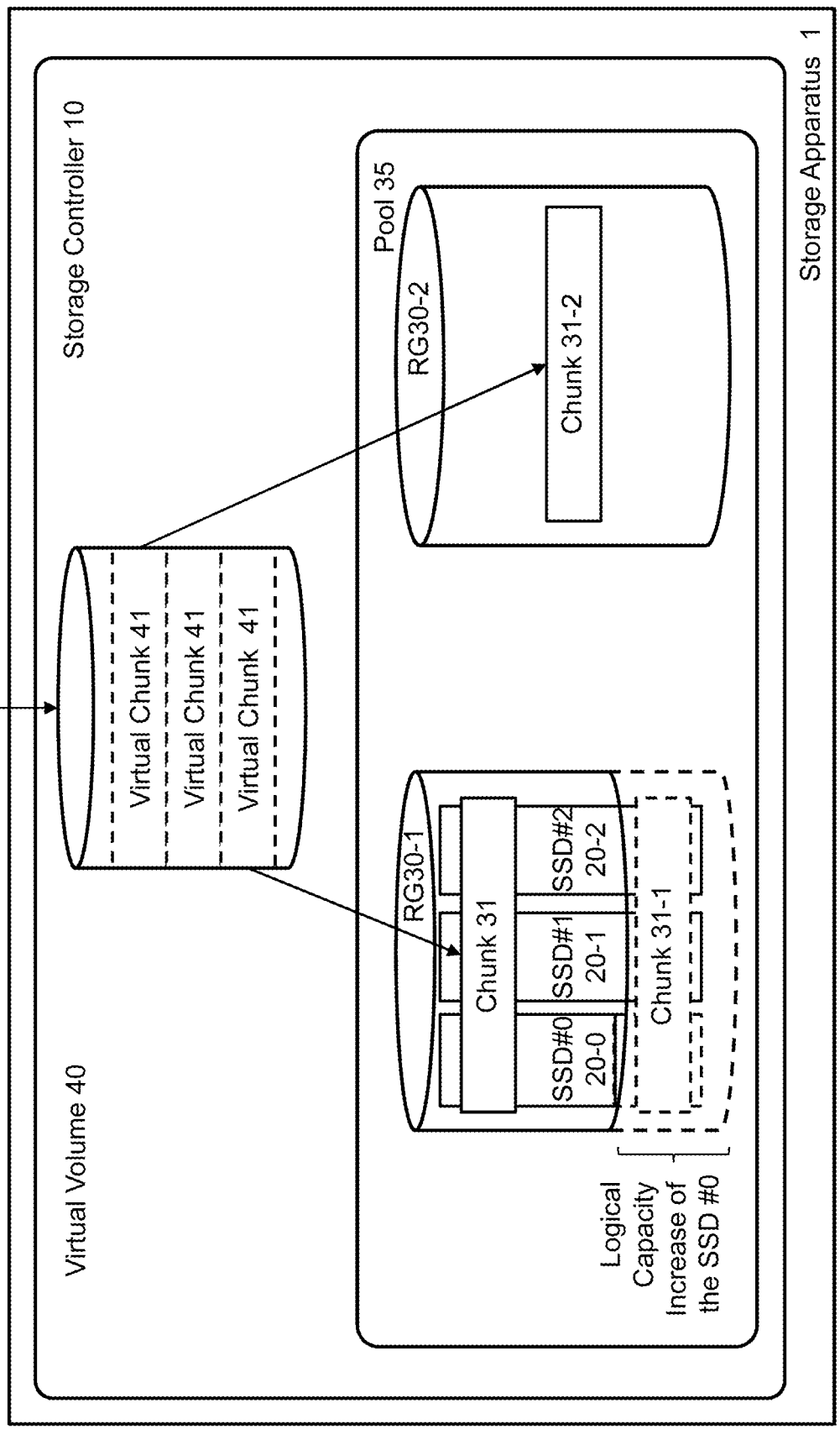
FIG. 5 is a diagram illustrating a relationship between a virtual volume, a RAID group, and a pool.

FIG. 5 is a diagram illustrating the relationship between a virtual volume, a RAID group, and a pool. The storage controller 10 may provide one or more virtual storage spaces to the host 2 that differ from the storage areas of the RAID group. This virtual storage space may be referred to as a "virtual volume." The storage space of the virtual volume, as well, may be divided and managed for each area of a predetermined size. These predetermined size areas may be called "virtual chunks." The virtual chunk may be a unit of allocation for a storage area of a virtual volume.

One chunk may be mapped to one virtual chunk, and when data is written from the host 2 to a virtual chunk, data may be stored in the mapped chunk. However, when a chunk is mapped to a virtual chunk, only the data stripes in the chunk are mapped. As such, the size of the virtual chunk is equal to the total size of all the data stripes included in the chunk. The storage controller 10 may include a management table for recording the mappings between the virtual chunks and the chunks, and manage the storage areas (chunks) allocated to the virtual chunk by using this management table.

Immediately after a virtual volume is defined, no chunk may be mapped to each virtual chunk of the virtual volume. Only when the storage controller 10 receives a write request for an area on the virtual chunk from the host 2, it determines the storage area (chunk) on the logical address space of the SSD 21 to which the data written to the area should be written. The chunk determined here may be a single chunk determined from chunks that have not yet been assigned to any virtual chunk (unused chunks).

In the present embodiment, a set of RAID groups having a storage area (chunk) that can be allocated (mapped) to a virtual chunk is referred to as a pool. When a chunk is allocated to a virtual chunk of the virtual volume, the storage apparatus 1 may select one unused chunk from the RAID groups managed by the pool, and assign the selected chunk to the virtual chunk.

As described above, when the cell mode of the cell in the SSD 21 is changed from the MLC mode to the TLC mode, the logical capacity may increase. FIG. 5 illustrates an example where the logical capacity of the SSD #0 expands. In this way, as the logical capacity of the SSD 21 increases, the number of chunks 31 that can be formed from the RAID group including the SSD 21 also increases. However, as the chunk 31 is a storage area composed of one or more stripe sequences, even if the logical capacity of one SSD 21 in the RAID group increases, the number of chunks 31 does not increase. When the logical capacity of the SSD 21 having the smallest logical capacity among the SSDs 21 in the RAID group increases, the chunks 31 can increase.

Next, the management information used in the storage controller 10 will be described. Although the storage controller 10 includes a large amount of management information, the following description will primarily focus on the management information related to the cell mode processing, which is the subject of the description in the present embodiment.

FIG. 6 is a diagram for explaining a configuration of the RAID group management table.

The RAID group management table 650 may be a table for managing the RAID group managed by the storage apparatus 1 and the attribute information of the SSD 21 belonging to the RAID group, and may be stored in the memory 14. Each row (record) of the RAID group management table 650 may store attribute information of the management target RAID group, or attribute information of the SSD 21 belonging to the management target RAID group. The RAID group management table 650 may include columns for an RG #651, a RAID level 652, a drive number 653, a logical capacity 654, a number of remaining erasures 655, a start data 656, a difference ratio 657, a predicted lifetime value 658, a T. Cell 659, and a last execution data 660.

A RAID group identification number (RAID group number, alternatively denoted as RG #) may be stored in RG #651, and the RAID level 652 may indicate the RAID level of the RAID group. An identifier for the SSD 21 belonging to the RAID group may be stored in the drive number 653.

The logical capacity of the storage device (SSD 21) designated by the drive number 653 may be stored in the logical capacity 654. In the present embodiment, the initial values of the logical capacities of each SSD 21 belonging to the respective RAID groups (the logical capacities at the time of installation in the storage apparatus 1) are assumed to be equal, but as another embodiment, RAID groups may be formed using SSDs 21 having different logical capacities. As described above, the value of the logical capacity 654 may change as time elapses.

The number of remaining erasures of the storage device (SSD 21) designated by the drive number 653 may be stored in the number of remaining erasures 655. As described above, the SSD 21 also manages the number of remaining erasures internally, but the SSD 21 manages the number of remaining erasures of blocks in the SSD 21 for each block. In contrast, the value stored in the number of remaining erasures 655 is the sum total of the number of remaining erasures for each block. Hereinafter, the phrase "number of remaining erasures of SSDs" will be used to refer to the total value of the number of remaining erasures of all the blocks in the SSD 21. The SSD 21 of the present embodiment may include functionality for returning the number of remaining erasures of the SSD 21 to the initiator in response to receiving an acquisition request for the number of remaining erasures from an initiator such as the DKC 10 or the like. The DKC 10 may obtain information regarding the number of remaining erasures from the SSD 21 by issuing an acquisition request for the number of remaining erasures to the SSD 21, and store the received information in the number of remaining erasures 655.

The date on which operation of the SSD 21 was started (referred to as the operation start date) may be stored in the start date 656. In particular, when the SSD 21 is installed in the storage apparatus 1 and the RAID group including the SSD 21 is defined by the administrator, the DKC 10 stores the date at that time in the start date 656.

The difference ratio 657 is an index value used by the DKC 10 in the present embodiment to predict changes in the operating state of each SSD 21. The method for calculating the difference ratio will be described later herein. The DKC 10 may calculate the difference ratio 657 of each SSD 21 periodically based on a predetermined time (for example, one month, etc.). Difference ratios 657 calculated in the past may also be recorded in the group management table 650. When the DKC 10 calculates a difference ratio, the calculated value may be stored in D0 (657-0). Then, the difference ratio calculated one time unit ago (for example, one month ago) from the time when the value was stored in D0 (657-0) may be stored in D1 (657-1). Similarly, the difference ratio calculated two time units ago (for example, two months ago) from the time when the value was stored in D0 (657-0) is stored in D2 (657-2), and the difference ratio calculated three time units ago (for example, three months ago) from the time when the value was stored in D0 (657-0) may be stored in D3 (657-3).

T. Cell 659 is information regarding permissions for cell mode modification. When "0" is stored in the T. Cell 659 of a record, the DKC 10 does not perform the cell mode modification process on the SSD 21 in the RAID group corresponding to the record. In contrast, if "1" is stored in Cell 659, the DKC 10 may perform the cell mode modification process for the SSD 21 in the RAID group corresponding to the record. A user (administrator) of the storage apparatus 1 may store a value in the T. Cell 659 when defining the RAID group.

In the last execution date 660, the most recent date among the days in the past when the cell mode modification process was performed on the SSD 21 belonging to the management target RAID group may be stored. In an initial state (immediately after the RAID group is defined), NULL (an invalid value; for example, a value not used as a date, such as 0) may be stored in the last execution date 660.

The predicted lifetime value of the SSD 21 calculated by the DKC 10 based on the rate of change of the number of remaining erasures of the SSD 21 may be stored in the predicted lifetime value 658. In the definition of service life in the storage apparatus 1 according to the present embodiment, it is defined that when the number of remaining erasures of the SSD 21 becomes 0, the SSD 21 has reached the end of its service life. As such, the date (time) at which it is predicted that the number of remaining erasures of the SSD 21 will become 0 is the predicted lifetime value. The DKC 10 may predict the time when the number of remaining erasures of the SSD 21 will become 0 based on the rate of change of the number of remaining erasures of the SSD 21. A detailed description of the method of calculating the predicted lifetime value will be provided later herein. It should be noted that, rather than defining the date (time) at which the number of remaining erasures of the SSD 21 will become 0 as the end of service life, the service life may be day (time) when the number of remaining erasures of the SSD 21 falls below a predetermined threshold value (wherein the threshold value is 0 or more.)

In addition, the RAID group management table 650 may include information other than the information described above. For example, the number of chunks that can be defined in each RAID group or the like may be stored in the RAID group management table 650.

The DKC 10 may also include management information other than the RAID group management table 650. For example, a table for managing the mapping relationship between the virtual chunks in each virtual volume defined in the storage apparatus 1 and corresponding chunks, or a table for managing the usage status of chunks in the pool may be included. However, as these are substantially the same as the information normally possessed by existing storage devices having functionality to provide virtual volumes to hosts, a description thereof will be omitted herein.

Next, the flow of each process will be described. First, a program executed by the storage controller 10 will be described. As examples, a configuration management program 141, a cell mode control program 142, and an I/O program 143 may be stored in the memory 14 of the storage apparatus 1. By executing these programs using the CPU 11 of the storage controller 10, the various processes described below may be performed. However, in order to avoid redundant explanation, in the following description of each process, each process may be explained with the program as the subject.

The configuration management program 141 may be a program for managing virtual volumes and RAID groups defined by the storage apparatus 1. When a user issues a RAID group definition instruction to the storage apparatus 1 using the management host 5, the configuration management program 141 may be executed in (the CPU 11 of) the storage apparatus 1. The configuration management program 141 may store information (for example, an identifier of the SSD 21 belonging to the RAID group) in the RAID group management table 650 based on the instructions from the user.

In addition, when defining a RAID group, the user may also specify whether or not to allow the SSDs 21 belonging to the RAID group to change the cell mode. When the user allows the SSD 21 belonging to the RAID group to change the cell mode, the configuration management program 141 may store "1" in the T. Cell 659 of the record for the definition target RAID group among the records in the RAID group management table 650. If the user does not allow the SSD 21 belonging to the RAID group to change the cell mode, "0" may be stored in the T. Cell 659.

The I/O program 143 may be a program for processing I/O requests (read commands and write commands) from the host 2. As the details of the specific processing executed by the I/O program 143 are not directly related to this embodiment, the description thereof will be omitted herein.

The cell mode control program 142 may be a program that determines whether or not cell mode modification is necessary based on the operating state of the SSD 21, and may cause the SSD 21 to perform the cell mode modification process as necessary.

The flow of the entire process of the cell mode modification process performed in the storage apparatus 1 will be described with reference to FIG. 7. Note that, in each of the Figures including and following FIG. 7, the letter "S" preceding the reference numeral means "Step."

Step 1 and Step 2 are part of the process performed when a RAID group is defined, and these steps may be executed by the configuration management program 141. Note that the description of the process of defining a RAID group is omitted herein. In Step 1, a user may use the management host 5 to issue an instruction to the storage apparatus 1 to allow the SSDs 21 belonging to the RAID group to modify the cell mode. Next, the configuration management program 141 may receive this instruction.

Subsequently, in Step 2, the configuration management program 141 may store "1" in the T. Cell 659 of the record for the definition target RAID group. Upon completion of this process, the configuration management program 141 may notify the user that the definition of the RAID group has been completed, and, in the case that the user allows cell mode modification, that configuration of the cell mode modification has been performed.

The RAID group may be accessed (read to or written from) by the I/O program 143. For example, when the RAID group defined in Step 1 and Step 2 is registered in the pool, the I/O program 143 may map the chunk in the defined RAID group to the virtual chunk of the virtual volume and perform I/O processing on the mapped chunks in response to the host 2 issuing a write command to the virtual volume. However, as the specific content of the processing of the I/O program 143 is not directly related to this embodiment, the description thereof will be omitted herein.

After the RAID group is defined, the cell mode control program 142 may periodically (for example, once a month) perform processing with respect to the RAID groups (Step 3 to Step 6). The description provided herein will focus on the exchange performed between the storage controller 10 and the SSD 21 and the exchange performed between the user and the storage controller 10.

The cell mode control program 142 may be executed for each RAID group. However, the processes of Step 3 to Step 6 are only performed for RAID groups for which "1" is set in the T. Cell 659 of the RAID group management table 650. In the following, an example will be described in which the cell mode control program 142 is executed with respect to RG # n (wherein n is a non-negative integer value, and "RG # n" refers to the RAID group with RAID group number n). When the cell mode control program 142 is initiated, first, the cell mode control program 142 issues an acquisition request for the number of remaining erasures to each SSD 21 belonging to RG # n (Step 3). Upon receiving the acquisition request for the number of remaining erasures, the SSD 21 may return the number of remaining erasures of the SSD 21 to the storage controller 10 (Step 4).

Subsequently, the cell mode control program 142 may determine whether or not cell mode modification is necessary by using the number of remaining erasures of the SSD 21 received in Step 4 (Step 5). In the event that it is determined in Step 5 that a cell mode modification is necessary, the cell mode control program 142 may calculate the number of remaining erasures that an SSD 21 belonging to the RG # n can perform in a predetermined number of years of operation, and perform the cell mode modification process (Step 6). Note that, in the present embodiment, an example will be described in which the expected service life of the SSD 21 is at least 5 years. A detailed description of Steps 5 and Step 6 will be provided later. Note that, in the present embodiment, the cell mode modification process in Step 6 may be referred to as "T. Cell" in some cases. In addition, in the event that it is determined in Step 5 that a cell mode modification is unnecessary, the cell mode control program 142 may not perform Step 6, and may end the process.

Figure 8:
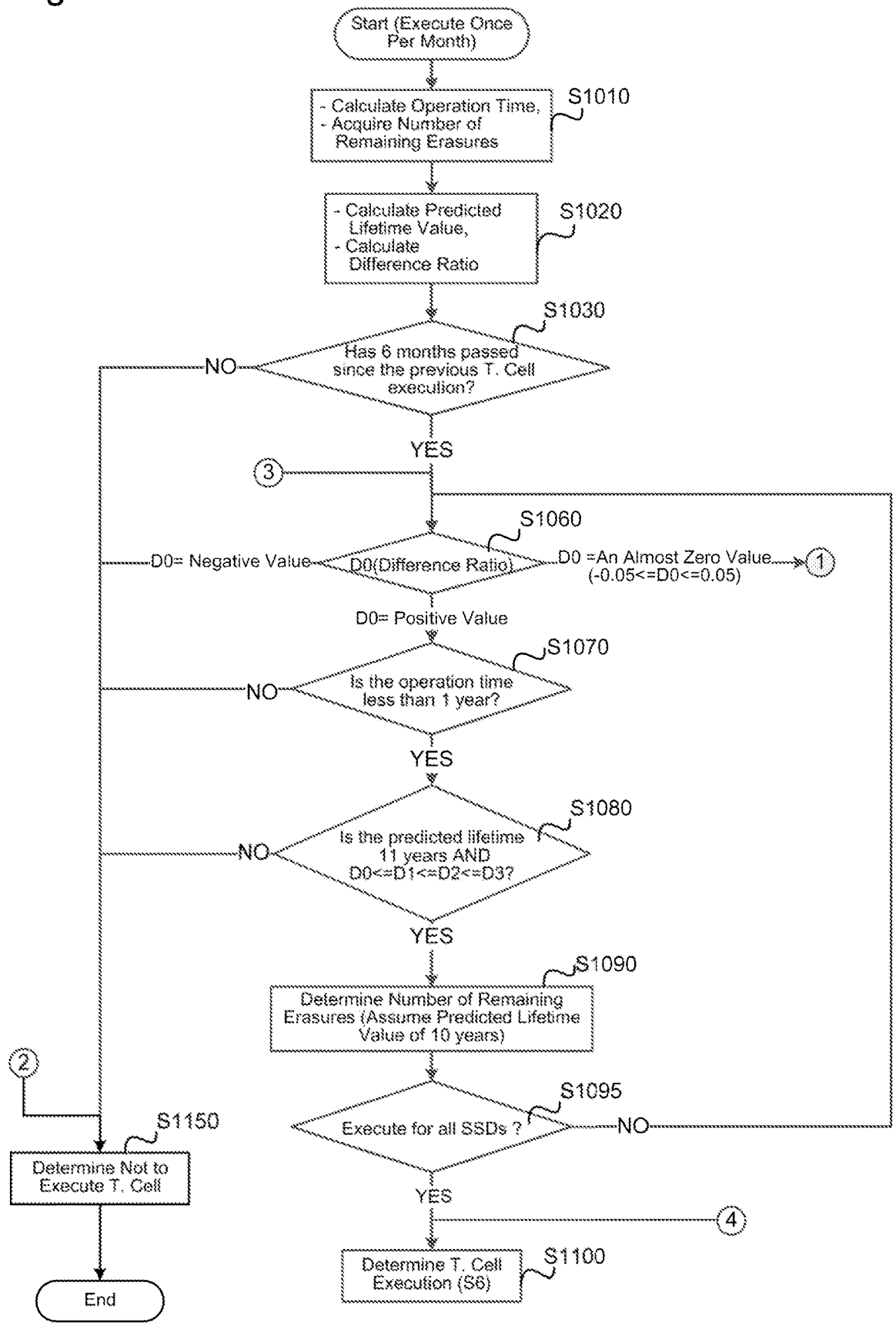
FIG. 8 is a flowchart (1) of a cell mode modification necessity determination process.
Figure 9:
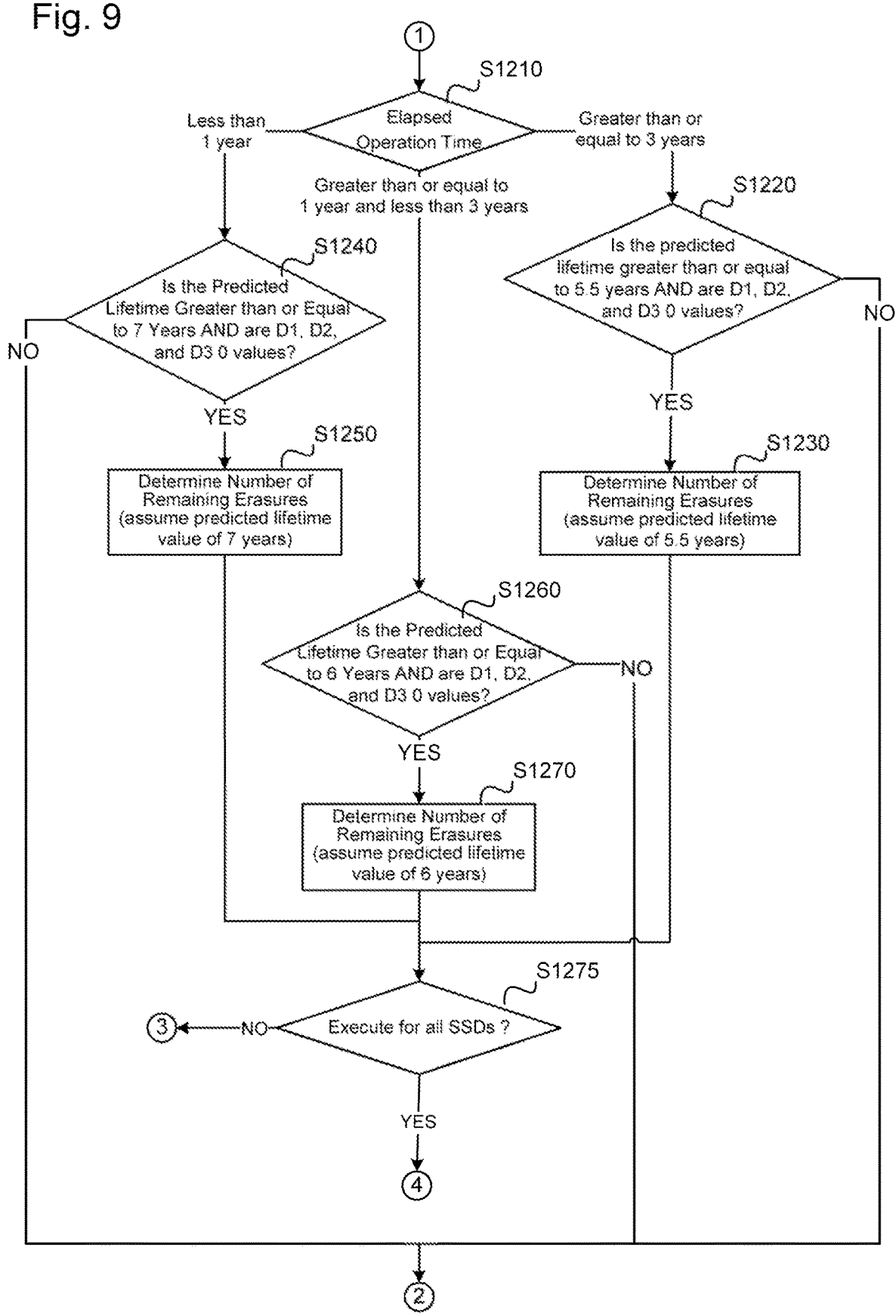
FIG. 9 is a flowchart (2) of a cell mode modification necessity determination process.

Next, the details of the processes of Step 3 to Step 5 in FIG. 7 will be described with reference to FIG. 8 and FIG. 9. Note that the processes described in FIG. 8 and FIG. 9 are processes that substantially correspond to Step 3 to Step 5 in FIG. 7. The details of Step 6 are described in FIG. 13.

Step 1010: The cell mode control program 142 may calculate the operation time of each SSD 21 belonging to RG # n. In the present embodiment, the operation time of the SSD 21 may refer to the elapsed time since the SSD 21 started operation, and may be a value obtained by subtracting the operation start date of the SSD 21 (the value stored in the start date 656 of the RAID group management table 650) from the current date (time).

In addition, in Step 1010, the cell mode control program 142 may issue an acquisition request for the number of remaining erasures to each SSD 21 in order to acquire the number of remaining erasures of each SSD 21 belonging to RG # n. The SSD 21 that receives the acquisition request for the number of remaining erasures may reference the block management table 1150 and calculate the total number of remaining erasures 1155 of all blocks included in the SSD 21. Next, the SSD 21 may return the calculated total value (that is, the number of remaining erasures of the SSD 21) to the storage controller 10 (cell mode control program 142).

Step 1020: The cell mode control program 142 may calculate the predicted lifetime value and the difference ratio of each SSD 21 belonging to RG # n. Hereinafter, the definition and calculation method of the predicted lifetime value and the difference ratio will be described.

The concept of a method for calculating the predicted lifetime value will be described with reference to FIG. 10. Points (a1) and (a2) in FIG. 10 may be obtained by plotting the number of remaining erasures of a particular SSD 21. In the coordinate system depicted in FIG. 10, the horizontal axis may represent time (date and time), and the vertical axis may represent the remaining number of erasures. The point (a2) may represent the number of remaining erasures (N2) of the SSD 21 at the current time (T2), and the point (a1) may represent the number of remaining erasures (N1) of the SSD 21 at the time (T1) of previous execution of the cell mode control program 142. Note that in the following description of Step 1020, the current time (date and time) may refer to the time (date and time) at the point in time (instant) at which the current cell mode control program 142 is being executed.

Figure 10:
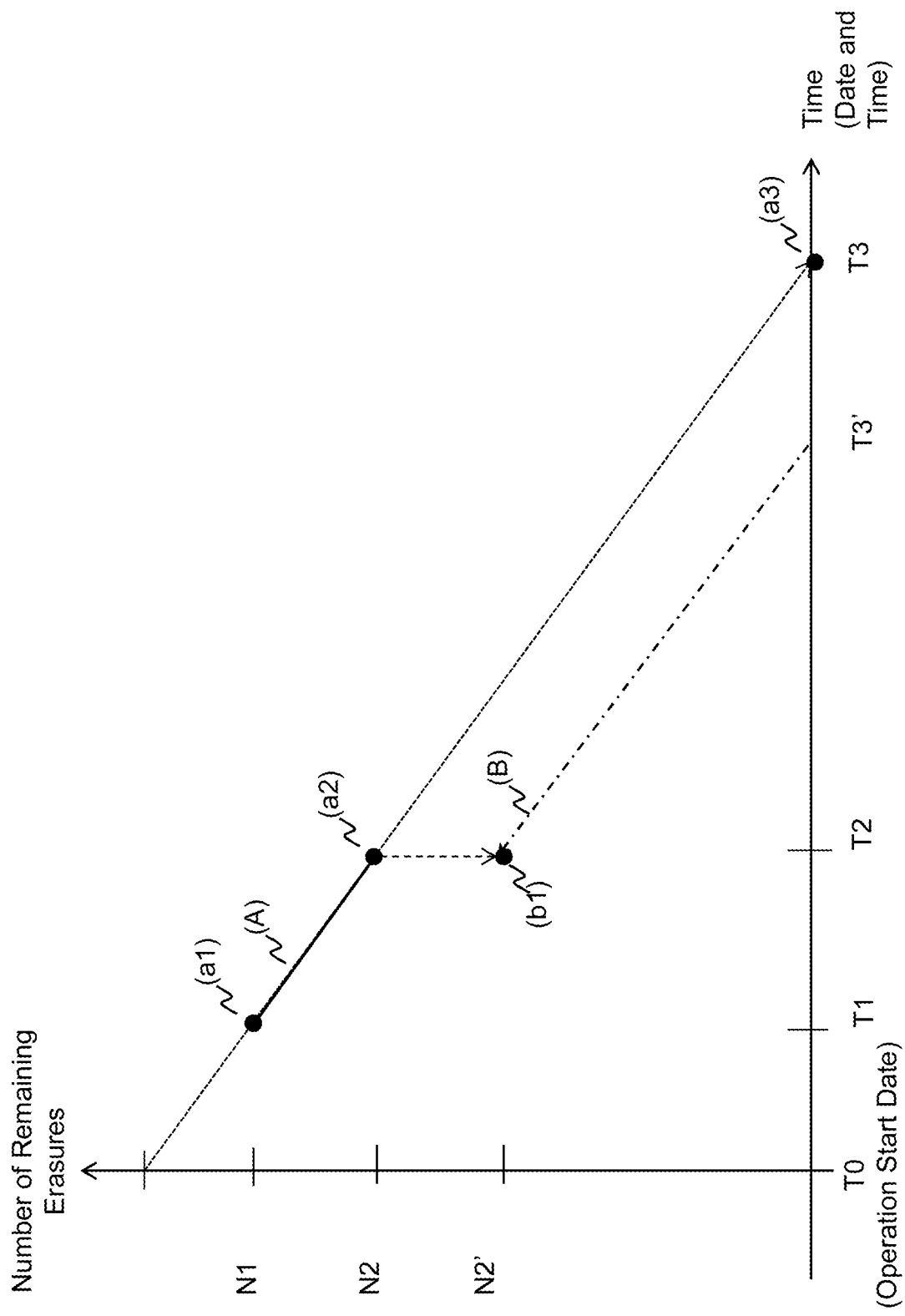
FIG. 10 is a diagram for explaining a method of calculating a predicted lifetime value.

In this case, the (average) rate of change of the number of remaining erasures of the SSD 21 from the time T1 to the time T2 is equal to the slope of the straight; line (A) in FIG. 10 (herein, this slope may also be labeled G in some cases), and G can be expressed by the following Expression 1.

[Formula 1]
$$G = \frac{N2 - N1}{T2 - T1} \quad (1)$$

When calculating the predicted lifetime value, the calculation is performed under the assumption that the number of remaining erasures of the SSDs 21 decreases with the rate of change obtained from Expression 1. As described above, the predicted lifetime value may be the time at which the number of remaining erasures of the SSD 21 becomes 0. Accordingly, the intersection point (the point (a3) in FIG. 10) between the extension of the straight line (A) and the horizontal axis in FIG. 10 may represent the predicted lifetime value. Assuming that the lifetime prediction is T3, T3 may be expressed by the following Expression 2.

[Formula 2]
$$T3 = T2 - \frac{N2 \times (T2 - T1)}{N2 - N1} = T2 - \frac{N2}{G} \quad (2)$$

The cell mode control program 142 may calculate T3 using Expression 2, and thereby obtain the predicted lifetime value of the SSD 21.

Next, the difference ratio will be described. The predicted lifetime value of the SSD 21 described above may be a value calculated on the basis of the assumption that the rate of change of the number of remaining erasures of the SSD 21 is constant, but it is also possible that the rate of change of the number of remaining erasures may fluctuate. Accordingly, it is possible that the predicted lifetime value derived based on the rate of change of the number of remaining erasures may also fluctuate. The difference ratio may be an index value indicating a fluctuation tendency of the predicted lifetime value.

The cell mode control program 142 may calculate the difference ratio by using the following Expression 3. Note that, in the following Expression 3, L0 is the operation start date (start date 656) of the SSD 21, L1 is the most recent predicted lifetime value (the predicted lifetime value calculated when the current cell mode control program 142 is executed), L2 is the predicted lifetime value calculated when the previous cell mode control program 142 was executed, and D is the difference ratio.

[Formula 3]
$$D = \frac{(L1 - L0) - (L2 - L0)}{L1 - L0} = \frac{L1 - L2}{L1 - L0} \quad (3)$$

When the difference ratio D takes a positive value, this indicates that the predicted lifetime value (L1) is in an increasing trend (it is larger than the previous predicted lifetime value L2). In this case, for example, it is conceivable that the write frequency to the SSD 21 is in a decreasing trend. Conversely, when the difference ratio D takes a negative value, this indicates that the predicted lifetime value (L1) is in a decreasing trend (it is less than the previous predicted lifetime value L2). In this case, for example, it is conceivable that the write frequency to the SSD 21 is in an increasing trend.

Further, when the difference ratio is 0 or close to 0, this indicates that there is almost no difference between L1 and L2 (there is no fluctuation of the predicted lifetime value). In this case, it can be assumed that there is no change in the write frequency to the SSD 21 (constant write frequency).

In Step 1020, the cell mode control program 142 may calculate the predicted lifetime value and the difference ratio of each SSD 21 belonging to RG # n using the above-described Expression 2 and Expression 3. In addition, after calculating the difference ratio, the cell mode control program 142 may store the number of remaining erasures and the predicted lifetime value of each SSD 21 belonging to RG # n in the number of remaining erasures 655 and the predicted lifetime value 658 of the RAID group management table 650, respectively. As such, at the start of execution of Step 1020, the number of remaining erasures and the predicted lifetime values of the SSD 21 at the time when the cell mode control program 142 was previously executed may be stored in the number of remaining erasures 655 and the predicted lifetime value 658, respectively.

For example, when calculating the predicted lifetime value and the difference ratio for a certain SSD 21 belonging to RG # n (for example, the SSD 21 with drive number k. Hereinafter referred to as "SSD # k), the following procedure may be used. The cell mode control program 142 may substitute the number of remaining erasures of the SSD # k obtained in Step 1010 in for N2 in Expression 2, and substitute the number of remaining erasures 655 of the record corresponding to the SSD # k from among the records of the RAID group management table 650 in for N1. Further, the cell mode control program 142 may substitute the current time (date and time) in for T2, and substitute the time (date and time) at which the cell mode control program 142 was previously executed in for T1. The cell mode control program 142 may be executed periodically (for example, once a month). As such, when the cell mode control program 142 is executed once a month, for example, the cell mode control program 142 may substitute the date and time one month before the current time (date and time) in for T1. The cell mode control program 142 may calculate the predicted lifetime value of each SSD 21 by executing this calculation for each SSD 21 belonging to RG # n.

Subsequently, the cell mode control program 142 may substitute the predicted lifetime value, obtained by using Expression 2 in for L1 in Expression 3, substitute the predicted lifetime value calculated when the cell mode control program 142 was previously executed (stored in the predicted lifetime value 658 of the record corresponding to the SSD # k among the records of the RAID group management table 650), in for L2 of Expression 3, and substitute the operation start date (stored in the start date 656 of the record corresponding to the SSD # k in among the records of the RAID group management table 650) in for L0 of Expression 3 in order to calculate the difference ratio D of the SSD # k.

After calculating the difference ratio D, the cell mode control program 142 may move each of the values stored in D0 (657-0), D1 (657-1), and D2 (657-2) of the records corresponding to the SSD # k among the records of the RAID group management table 650 to D1. (657-1), D2 (657-2), and D3 (657-3), respectively. Subsequently, the cell mode control program 142 may store the value of the difference ratio D calculated using Expression 3 above into D0 (657-0). In this way, the most recent difference ratio D, the difference ratio calculated 1 month ago, the difference ratio calculated 2 months ago, and the difference ratio calculated 3 months ago may be stored in D0 (657-0), D1 (657-1), D2 (657-2), and D3 (657-3), respectively.

Step 1030: The cell mode control program 142 may determine whether or not a predetermined period has elapsed since the cell mode control program 142 last performed the cell mode modification process on the SSD 21 belonging to RG # n. Here, the "predetermined period" is a period longer than the cycle in which the cell mode control program 142 is executed with respect to RG # n. In the present embodiment, an example in which the "predetermined period" is 6 months is described, but the "predetermined period" is not necessarily 6 months. It may be sufficient for the "predetermined period" to be a period longer than the cycle in which the cell mode control program 142 is executed. Mere particularly, in step 1030, the cell mode control program 142 may determine whether or not the last execution date 660 of the record storing information regarding the RG # n (the record with RG #651 of "n") among the records in the RAID group management table 650 is 6 months or more before the current time.

However, in the event that a cell mode modification process has never been performed for the SSD 21 belonging to the RG # n (for example, a case where the RG # n has been recently introduced to the storage system 1), NULL is stored in the last execution date 660. In that case, the cell mode control program 142 may determine whether a predetermined period (for example, six months) has elapsed since the operation start date (start date 656) of all the SSDs 21 belonging to RG # n.

In the event that sixth months or more have not passed since the last execution of the cell mode modification progress (Step 1030: NO), the cell mode control program 142 may determine not to modify the cell mode of all the SSDs 21 belonging to RG # n, and ends the process (Step 1150). Also, in Step 1150, the cell mode control program 142 may store the number of remaining erasures of each SSD 21 acquired in Step 1010 in the number of remaining erasures 655 in the RAID group management table 650, store the predicted lifetime value calculated in Step 1020 in the predicted lifetime value 658 of the RAID group management table 650, and subsequently end the process.

In contrast, if the determination in Step 1030 is affirmative, the processing from Step 1060 onward may be performed. Note that the processes including and following Step 1060 may be performed for each SSD 21 belonging to RG # n. Hereinafter, a case where Steps 1060 to 1270 are performed for one SSD 21 belonging to RG # N (provisionally referred to as "SSD # k") will be described.

Step 1060: The cell mode control program 142 may reference D0 (657-0) of SSD # k (D0 (657-0) is the difference ratio D calculated in Step 1020). Next, the cell mode control program 142 may determine which of any one of the following (a) to (c) the D0 (657-0) of the SSD # k corresponds to.

(a) A value very close to 0
(b) A negative value
(c) A positive value

Here, when D0 (657-0) is in the range of −α to α, the cell mode control program 142 may determine that D0 (657-0) is "a value very close to 0" (corresponding to "a"). It should be noted that α is a value that satisfies the relationship $0<\alpha<1$, and is a value close to 0 (for example, 0.05 or the like). In the following, unless otherwise noted, an example of the case where α=0.05 will be described.

When D0 (657-0) is smaller than −α, the cell mode control program 142 may determine that D0 (657-0) is a negative value (corresponding to "b"). If D0 (657-0) is larger than α, the cell mode control program. 142 may determine that (657-0) is a positive value (corresponding to "c").

When D0 (657-0) of SSD # k corresponds to (b) (Step 1060: D0=a negative value), the cell mode control program 142 may determine not to execute the cell mode modification process for all the SSDs 21 in RG # n (Step 1150), and end the process. In this case, as described above, it may be assumed that the write frequency to the SSD 21 is in a decreasing trend. If the future write frequency for the SSD # k increases, there is a possibility that the actual lifetime may be shorter than the predicted lifetime value obtained in step 1020. As such, in this case, the cell mode control program 142 may determine not to execute the cell mode modification process.

When D0 (657-0) of SSD # k corresponds to (c) (Step 1060: D0=a positive value), the cell mode control program 142 may then execute Step 1070. Also, when D0 (657-0) of SSD # k corresponds to (a) (Step 1060: D0=an almost zero value), the cell mode control program 142 may then execute Step 1210 (FIG. 9).

Step 1070: The cell mode control program 142 determines whether the operation time of the SSD # k (the value calculated in Step 1010) is less than one year. If the operation time of the SSD # k is 1 year or more (Step 1070: NO), the cell mode control program 142 may determine not to execute the cell mode modification process for all the SSDs 21 in the RG # n (Step 1150), and end the process. If the operation time of the SSD # k is less than 1 year (Step 1070: YES), the cell mode control program 142 may then execute Step 1080. As described above, when D0 (657-0) of SSD # k corresponds to (c), it may be assumed that the write frequency to the SSD # k is in a decreasing trend. As such, as there is a possibility that the actual lifetime of the SSD # k may be longer than the predicted lifetime value obtained in Step 1020, the cell mode modification process may be performed. However, in general, the access tendency to volumes or storage devices (the frequency of reading or writing by the host, etc.) may significantly fluctuate for a period of time (for example, sixth months) after the start of operation, after which the access tendency gradually stabilizes. Accordingly, the cell mode control program 142 may determine whether or not to execute the cell mode modification process based on the operation time of the SSD # k. When the operation time of the SSD # k is less than 1 year and the write frequency is in a monotonically decreasing trend, the cell mode control program 142 may determine that the access tendency of the SSD # k is beginning to stabilize, and determine that the cell mode modification process can be performed. However, as the operation time of the SSD # k is short, the cell mode modification process may be performed only when the predicted lifetime value is sufficiently long (for example, double or more than the assumed service life). Conversely, if the write frequency is decreasing, but the operation time of the SSD # k is more than 1 year, it may be assumed that the access tendency to the SSD # k differs from the general trend. For example, this may occur in cases when the type of data stored in the SSD # k is changed by an update from the host. In such a case, performing the cell mode modification process may be risky (e.g., there may be a risk that the lifetime of the SSD # k ends before its service life). Accordingly, in this case, the cell mode control program 142 may determine not to execute the cell mode modification process.

Step 1080: The cell mode control program 142 may determine whether or not the predicted lifetime value of the SSD # k is 11 years or more since the operation start date, and that the historical records of the difference ratio of SSD # k (D0 (657-0) to D3 (657-3)) satisfy the relationship D0≤D1≤D2≤D3. If the determination at Step 1080 is negative (Step 1080: NO); that is, the predicted lifetime value of the SSD # k is less than 11 years from the operation start date or the historical records of the difference ratio do not satisfy the relationship D0≤D1≤D2≤D3, the cell mode control program 142 may determine not to execute the cell mode modification process for all the SSDs 21 in the RG # n (Step 1150), and end the process. If the determination in Step 1080 is affirmative (Step 1080: YES), the cell mode control program 142 may then execute Step 1090.

Step 1090: In the event that the determination in Step 1080 is affirmative, there is a possibility that the predicted lifetime value of the SSD # k (11 or more years from the operation start date) may be longer than the expected service life (for example, 5 years) of the SSD 21. In addition, it can be said that the write frequency from the DKC 10 to the SSD # k is in a monotonically decreasing trend. In this case, the cell mode control program 142 may determine that it is desirable to increase the logical capacity of the SSD 21 even if the lifespan (predicted lifetime value) of the SSD 21 belonging to RG # n decreases. As such, the cell mode control program 142 may estimate the number of remaining erasures in the case when the predicted lifetime value of the SSD # k is reduced (or put differently, the number of remaining erasures in the case that the logical capacity of the SSD # k is increased). In the following, the predicted lifetime value of the SSD 21 when the logical capacity is increased may be referred to as a "target lifetime value," and the number of remaining erasures at that time may be referred to as a "target number of remaining erasures." In Step 1090, the cell mode control program 142 may obtain the number of remaining erasures using a target life value of the SSD # k set to 10 years after the start of operation. Here, the reason why the target lifetime value of the SSD # k is set to a value of 10 years from the start of operation, that is, a value that is twice the expected service life, is that the operation time of the SSD # k is short (less than one year after the start of operation), and the write frequency (update frequency) to the SSD # k may fluctuate in the future. By the cell mode control program 142 setting the target lifetime value to a high value, excessive cell mode modifications of the SSD # k may be avoided.

A method for calculating the target number of remaining erasures performed in Step 1090 (as well as below-described Step 1230, Step 1250, and Step 1270) will be described. Here, the information used in Step 1020 may be used again. Hereinafter, the current time (the time when the current cell mode control program 142 is being executed) is T2, and the time when the previous cell mode control program 142 was executed is T1. Also, N2 may represent the number of remaining erasures of the SSD # k at time T2 (the current time) used in Step 1020, and N1 may represent the number of remaining erasures of the SSD # k at time T1.

Here, the target lifetime value is T3', and the target number of remaining erasures is N2'. At this time, the target number of remaining erasures (N2') may be obtained using the following Expression 4.

[Formula 4]

$$N2' = \frac{(N2 - N1) \times (T2 - T3')}{T2 - T1} = G \times (T2 - T3') \qquad (4)$$

A method of calculating the number of target remaining erasures will be described once more with reference to FIG. 10. When the cell mode control program 142 calculates the target number of remaining erasures, similar to when the predicted lifetime value was calculated in Step 1020, the number of remaining erasures of the SSD 21 is calculated based on the assumption that it changes with the rate of change indicated by Expression 1. In Step 1020, a process may be performed in which the time when the number of remaining erasures becomes 0 is calculated, and this may be used as the predicted lifetime value. Conversely, in Step 1090, it is assumed that the predicted lifetime value (that is, the time when the number of remaining erasures becomes 0) is a predetermined value (for example, a time 10 years after the operation start date in Step 1090), and the minimum value of the current number of remaining erasures necessary to satisfy the predicted lifetime value may be obtained. The straight line A is the straight line used in the predicted lifetime value calculation performed in Step 1020.

In the calculation of the number of remaining erasures herein, similar to the calculation of the predicted lifetime value in Step 1020, calculation is performed under the assumption that the number of remaining erasures of the SSD 21 decreases with the rate of change obtained from Expression 1. If the determination in Step 1080 is affirmative, this may be the case where T3 of FIG. 10 is determined to be 11 years or more. In addition, in this case, as the lifetime (predicted lifetime value) of the SSD 21 is excessively long, it may be desirable to increase the logical capacity by slightly shortening the service life.

The straight line (B) in FIG. 10 is a straight line parallel to the straight line (A) (that is, a straight line with slope equal to the value indicated by Expression 1) that passes through the coordinates (T3', 0) (where T3'<T3). Further, the coordinate value of the point (b1) on the straight line (B) may have a value of T2 on the horizontal axis (time) and a value of N2' on the vertical axis (number of remaining erasures). Assuming that the number of remaining erasures of the SSD 21 decreases with the rate of change indicate by Expression 1, if the number of remaining erasures (N2') at the time T2 (current time) is present on the straight line (B) (point (b1) in FIG. 10), the predicted lifetime value (target lifetime value) may become T3' (the number of remaining erasures becomes 0 at time T3'). Expression 4 is an expression for obtaining the number of remaining erasures (that is, N2') at the time T2 on the straight line (B).

In Step 1090, the cell mode control program 142 may assign the same values to N1, N2, T1, T2 of Expression 4 as the values substituted in Step 1020, and may also substitute the date 10 years after the operation start date of the SSD # k in for T3' (the target lifetime value) in order to obtain N2'.

Step 1095: In the case that the cell mode control program 142 has not performed processing (from Step 1060 to Step 1090, or from Step 1210 to Step 1270) on all the SSDs 21 belonging to RG # n, the cell mode control program 142 may perform the process of Step 1060 with respect to the unprocessed SSD 21. If processing has been completed for all the SSDs 21 belonging to RG # n, the cell mode control program 142 may then perform Step 1100.

Step 1100: The cell mode control program 142 may determine to perform the cell mode modification process of the SSD # k using the target number of remaining erasures obtained in Step 1090. In addition, the cell mode control program 142 may store the number of remaining erasures acquired for each SSD 21 in Step 1010 in the number of remaining erasures 655 in the RAID group management table 650, and store the predicted lifetime value calculated in Step 1020 in the predicted lifetime value 658 of the RAID group management table 650. Subsequently, the cell mode control program 142 may execute Step 6 (the cell mode modification process). A detailed description of Step 6 will be provided later herein.

Next, processing (processing beginning with Step 1210 in FIG. 9) in the case that D0 (657-0) of the SSD # k is close to 0 (Step 1060: D0=an almost zero value) in the determination of Step 1060 will be described. In this case, as it is assumed that there is no change in the write frequency to the SSD # k (a constant write frequency), the cell mode control program 142 may generally determine that the cell mode modification process may be performed. A detailed description will be provided later herein.

Step 1210: The cell mode control program 142 may determine whether the operation time of SSD # k is less than 1 year, 1 year or more, less than 3 years, or 3 years or more.

In the event that it is determined in Step 1210 that the operation time is less than one year, Step 1240 may be executed. In Step 1240, the cell mode control program 142 may determine whether the predicted lifetime value of the SSD # k is 7 years or more from the operation start date, and whether the previously calculated difference ratios (D1, D2, D3) are all very close to 0 (values in the range of −α to α). If the determination in Step 1240 is negative (Step 1240: NO), the cell mode control program 142 may determine not to execute the cell mode modification process for all the SSDs 21 in the RG # n (Step 1150) and end the process. The reason why the cell mode control program 142 determines whether D1, D2, and D3 are values in the range of −α to α in Step 1240 is to verify that there is no change in the write frequency to the SSD 21; that is, to verify whether the access tendency to the SSD 21 is in a stable state. In the case that the access tendency to the SSD 21 is not stable, there is a risk that the write frequency (erase frequency) will increase in the future, and as such the cell mode control program 142 does not execute the cell mode modification process.

If the determination in Step 1240 is affirmative (Step 1240: YES), the cell mode control program 142 may perform the determination process of the number of remaining erasures for the SSD # k (Step 1250). The processing of Step 1250 may be substantially similar to that of Step 1090. Here, however, the target number of remaining erasures is determined for when the target lifetime value of the SSD # k is set to 7 years from the operation start date. That is, this differs from Step 1090 in that the predicted lifetime value is calculated by substituting the date 7 years from the operation start date into. T3' of Expression 4.

Subsequently, if the processing of Steps 1210 to 1270 has not been completed for all the SSDs 21 belonging to RG # n (Step 1275: NO), the cell mode control program 142 may repeat the processing from Step 1060 onward for the unprocessed SSDs 21. In the event that the determination at Step 1275 is affirmative, then Step 1100 may be executed.

If it is determined in Step 1210 that the operation time is greater than or equal to 1 year but less than three years, Step 1260 may be executed. In Step 1260, the cell mode control program 142 may determine whether the predicted lifetime value of the SSD # k is 6 years or more from the operation start date, and whether each of D1, D2, and D3 are values very close to 0 (values in the range of −α to α). If the determination at Step 1240 is negative (Step 1260: NO), the cell mode control program 142 may determine not to execute the cell mode modification process for all the SSDs 21 in the RG # n (Step 1150) and end the process.

If the determination in Step 1260 is affirmative (Step 1260: YES), the cell mode control program 142 may perform the determination process of the number of remaining erasures for the SSD # k (Step 1270). The processing of Step 1270 may be substantially similar to that of Step 1090. Here, however, the number of remaining erasures is determined for when the target lifetime value of the SSD # k is set to 6 years from the operation start date. That is, this differs from Step 1090 in that the predicted lifetime value is calculated by substituting the date 6 years from the operation start date into T3' of Expression 4.

Subsequently, if the processing of Steps 1210 to 1270 has not been completed for all the SSDs 21 belonging to RG # n (Step 1275: NO), the cell mode control program 142 may repeat the processing from Step 1060 onward for the unprocessed SSDs 21. In the event that the determination at Step 1275 is affirmative, then Step 1100 may be executed.

If it is determined in Step 1210 that the operation time is 3 years or more, Step 1220 may be executed. In Step 1220, the cell mode control program 142 may determine whether the predicted lifetime value of the SSD # k is 5.5 years or more from the operation start date, and whether each of D1, D2, and D3 are values very close to 0 (values in the range of −α to α). If the determination at Step 1220 is negative (Step 1220: NO), the cell mode control program 142 may determine not to execute the cell mode modification process for all the SSDs 21 in the RG # n (Step 1150), and end the process.

If the determination in Step 1220 is affirmative (Step 1220: YES), the cell mode control program 142 may perform the determination process of the number of remaining erasures for the SSD # k (Step 1230). The processing of Step 1230 may be substantially similar to that of Step 1090. Here, however, the number of remaining erasures is determined for when the target lifetime value of SSD # k is set to be 5.5 years from the operation start date. That is, this differs from Step 1090 in that the predicted lifetime value is calculated by substituting the date 5.5 years from the operation start date into T3' of Expression 4.

Subsequently, if the processing of Steps 1210 to 1270 has not been completed for all the SSDs 21 belonging to RG # n (Step 1275: NO), the cell mode control program 142 may repeat the processing from Step 1060 onward for the unprocessed SSDs 21. In the event that the determination at Step 1275 is affirmative, then Step 11 may be executed.

Figure 11:
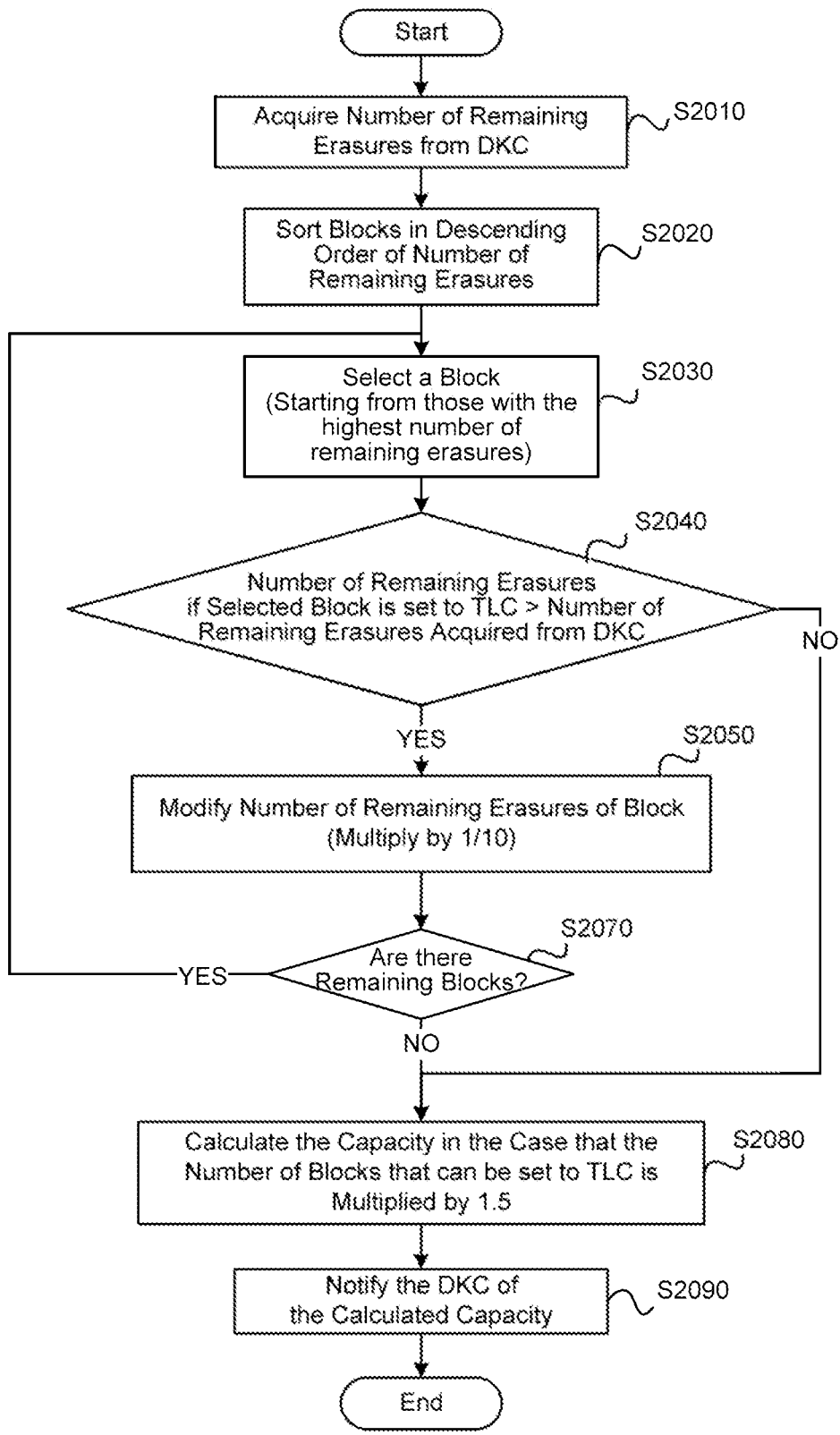
FIG. 11 is a flowchart of a process performed by an SSD that received a capacity verification command.
Figure 12:
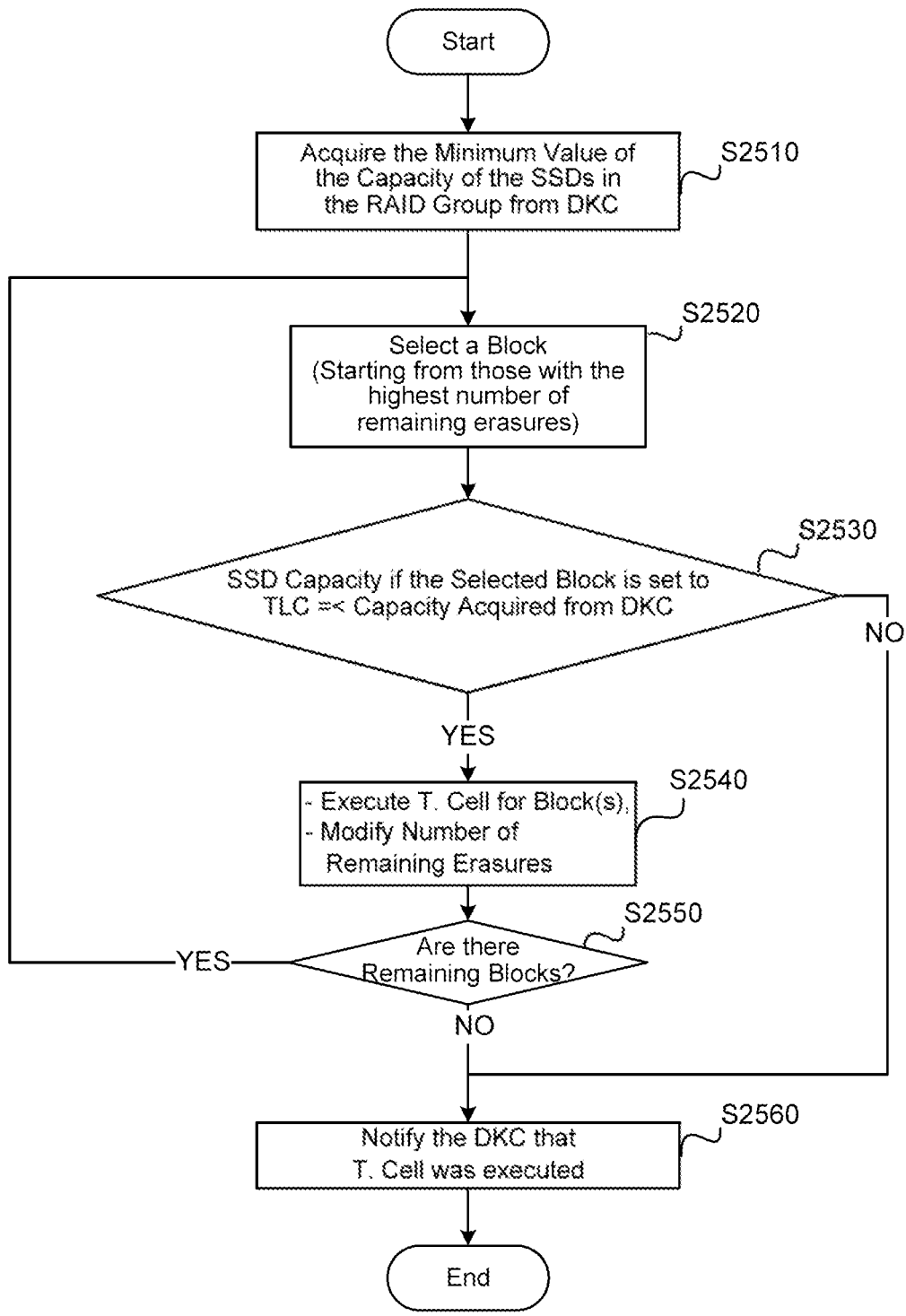
FIG. 12 is a flowchart of a process performed by an SSD that received a cell mode modification command.
Figure 13:
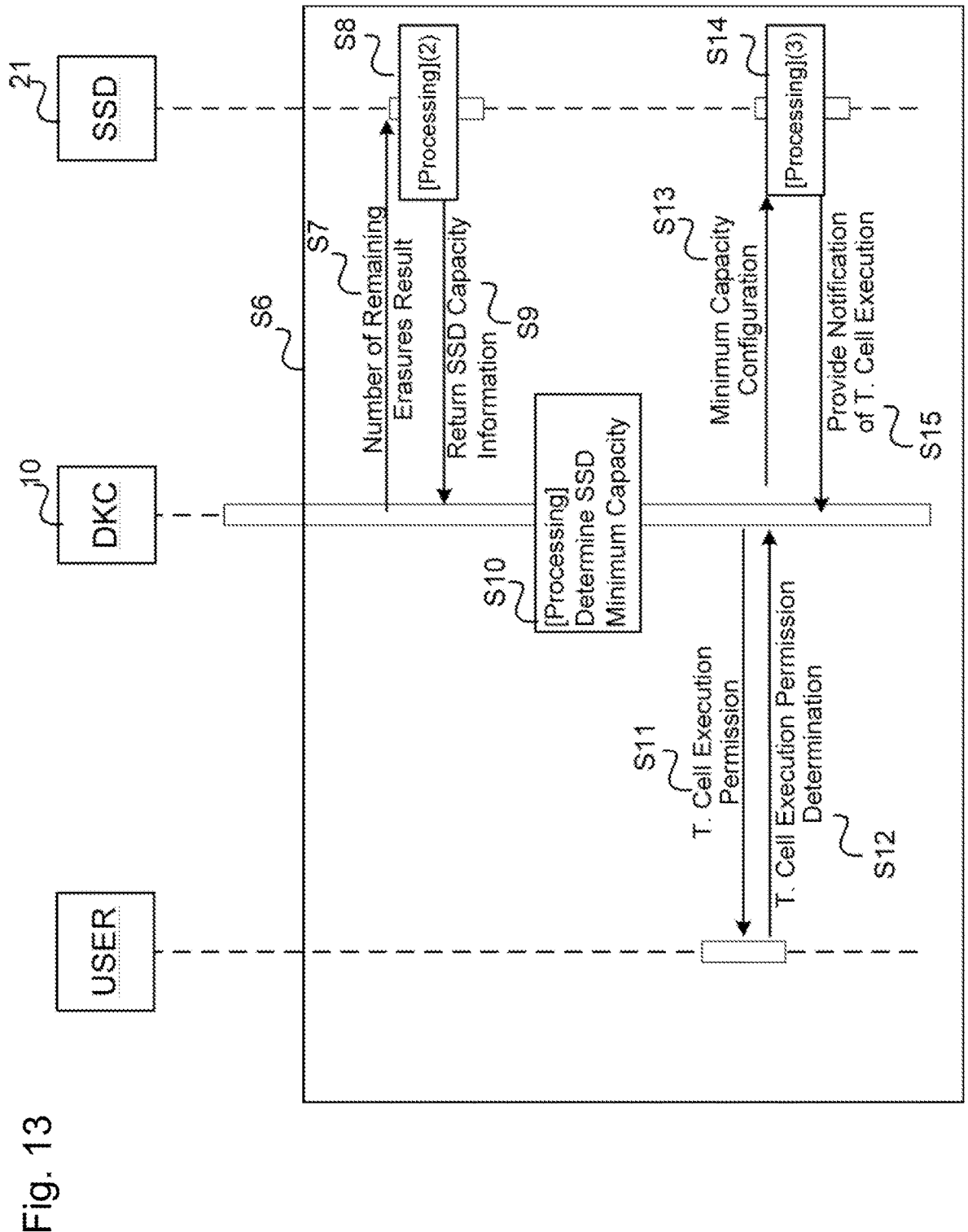
FIG. 13 is a flowchart of a cell mode modification process.

Next, details of the process (cell mode modification process) corresponding to Step 6 in FIG. 7 will be described with reference to FIG. 13, FIG. 11, and FIG. 12.

First, the outline of the process of Step 6 will be described with reference to FIG. 13. The cell mode control program 142 may issue a capacity verification command to each SSD 21 belonging to RG # n (Step 7). The capacity verification command may include information regarding the number of remaining erasures. The information regarding the number of remaining erasures included here may be the target number of remaining erasures of the SSD 21 obtained as a result of executing the processing depicted in FIG. 8 and FIG. 9 (processing corresponding to Step 3 to Step 5 in FIG. 7) by the cell mode control program 142.

When all or a portion of the blocks 211 of the SSDs 21 are changed from the MLC mode to the TLC mode, the logical capacity of the SSDs 21 increases but the number of remaining erasures is reduced. In response to receiving this command, the SSD 21 may obtain the number of blocks 211 that can be changed to the TLC mode by using the information regarding the number of remaining erasures included in the command, use this as a basis to calculate the logical capacity when the blocks 211 are changed to the TLC mode (Step 8), and the SSD 21 may return the calculated logical capacity to the storage controller 10 (Step 9). Note that a detailed description of the processing executed by the SSD 21 will be described alter.

The flow of processing executed by the SSD 21 in Step 8 will be described with reference to FIG. 11. The processing of FIG. 11 may be performed by the cell mode modification program 242 of the SSD 21.

Step 2010: In response to receiving the capacity verification command from the DKC 10, the cell mode modification program 242 may extract the information regarding the number of remaining erasures included in the capacity verification command.

Step 2020: The cell mode modification program 242 may create a copy of the block management table 1150. Herein, the copy created of the block management table 1150 may be referred to as a "duplicate table." Similarly to the block management table 1150, each column of the duplicate table may be referred to as a chip #1151, a die #1152, a block #1153, a mode 1154, and a number of remaining erasures 1155. The cell mode modification program 242 may then sort the records of the duplicate table in descending order of the number of remaining erasures 1155.

Step 2030: The cell mode modification program 242 may select one record from the duplicate table. The record selected herein may be a record that has not undergone the processing beginning with the below-described Step 2040, and has the largest number of remaining erasures 1155.

Step 2040: The cell mode modification program 242 may calculate the number of remaining erasures of the SSD 21 based on the contents of the duplicate table. At this time, the cell mode modification program 242 may calculate the number of remaining erasures of the SSD 21 on the assumption that the blocks managed by the record selected in Step 2030 have been changed from the MLC mode to the TLC mode. More particularly, the calculation is performed according to the procedure described below.

First, the cell mode modification program 242 may calculate the total value of the number of remaining erasures 1155 of all the records with the exception of the record(s) selected in Step 2030 in the duplicate table. Subsequently, the cell mode modification program 242 may calculate a value obtained by multiplying the number of remaining erasures of the record selected in Step 2030 by 0.1, and add the value calculated here to the total value of the number of remaining erasures 1155 calculated earlier.

Next, the cell mode modification program 242 may determine whether or not the number of remaining erasures of the SSD 21 calculated here is less than or equal to the number of remaining erasures received in Step 2010. In the case that the calculated number of remaining erasures of the SSD 21 is greater than the number of remaining erasures received in Step 2010 (Step 2040: YES), then Step 2050 is performed. In the case that the calculated number of remaining erasures of the SSD 21 is less than or equal to the number of remaining erasures received in Step 2010 (Step 2040: NO), the cell mode modification program 242 may skip the processing of Step 2050 to Step 2070, and proceed to perform Step 2080.

In Step 2040, if the mode 1154 of the record selected in Step 2030 is "1" (that is, if the block managed by the selected record is already in the TLC mode), Step 2050 to Step 2070 is skipped and Step 2080 is performed.

Step 2050: The cell mode modification program 242 may change (by multiplying by 0.1) the number of remaining erasures 1155 of the record selected in Step 2030, and change the mode 1154 of this record to "1."

Step 2070: The cell mode modification program 242 may determine whether there are any unprocessed records (records for which the processes of Step 2030, Step 2040 have not been performed) in the duplicate table. In the event that there is an unprocessed record (Step 2070: YES), the cell modification program 242 may once again perform the process of Step 2030. In the event that there are no unprocessed records (Step 2070: NO), then Step 2080 may be performed.

Step 2080: The cell mode modification program 242 may calculate the logical capacity of the SSD 21 when several blocks are changed to the TLC mode. In particular, the calculation described below is performed.

The cell mode modification program 242 may count the number of records in which the mode 1154 is "0" (represented as M) and the number of records in which the mode 1154 is "1" (represented as T) among the records in the duplicate table. The counted values (M, T) each respectively correspond to the number of blocks in the MLC mode and the number of blocks in the TLC mode when a portion of the blocks 211 in the SSD 21 are changed to the TLC mode. Next, the cell mode modification program 242 may calculate the logical capacity of the SSD 21 by calculating M×the size of the blocks in the MLC mode+T×the size of the blocks in the TLC mode. The size of the blocks in the TLC mode may be 1.5 times the size of the blocks in the MLC mode (as the number of bits storable in one cell 214 is 1.5 times that, of MLC).

Step 2090: The cell mode modification program 242 may notify the DKC 10 of the logical capacity of the SSD 21 calculated in Step 2080, discard the duplicate table, and end the process.

Hereinafter, the description will return to the explanation of FIG. 13; that is, the process executed by the cell mode control program 142 of the DKC 10.

After the logical capacity is returned from each SSD 21, the cell mode control program 142 may determine the minimum capacity of the SSDs 21 belonging to RG # n (Step 10). In particular, the cell mode control program 142 may identify the minimum value of the logical capacity returned from each SSD 21 belonging to RG # n. The identified value may be the minimum capacity of the SSDs 21 belonging to RG # n. Subsequently, the cell mode control program 142 may verify with a user whether the cell mode can be modified (Step 11). As an example, the cell mode control program 142 may cause the management host 5 to display a verification screen, as depicted in FIG. 14, on the display of the management host 5, and receive a reply from a user indicating whether or not to approve the modification of the cell mode. When a user presses the "Execute" button in the verification screen in FIG. 14, the management host 5 may return this fact to the cell mode control program 142 (Step 12).

In the event that the user does not allow modification of the cell mode; that is, when the user presses the "Do Not Execute" button in the verification screen, the cell mode control program 142 may end the process.

In the event that the user allows modification of the cell mode; that is, when the user presses the "Execute" button in the verification screen, the cell mode control program 142 may issue a cell mode modification command to each SSD 21 belonging to RG # n (Step 13). The cell mode modification command may include capacity information. The cell mode control program 142 may issue, to each SSD 21, a cell mode modification command in which the minimum capacity of the SSD 21 determined in Step 10 is set as capacity information. In response to receiving this command, the SSD 21 may modify the cell mode of some of the blocks in the SSD 21 from the MLC mode to the TLC mode (Step 14) using the capacity information included in the command. After Step 14, the SSD 21 notifies the DKC 10 that the cell mode modification has been completed (Step 15).

The details of the processing (Step 14) performed by the SSD 21 that received the cell mode modification command will be described with reference to FIG. 12.

Step 2510: In response to receiving the cell mode modification command from the DKC 10, the cell mode modification program 242 may extract the capacity information included in the cell mode modification command. As described above, this capacity information may be the minimum capacity of the SSDs 21 belonging to # n as determined in Step 10.

Step 2520: The cell mode modification program 242 may select one record from the block management table 1150. The record table selected here may be a record that has not undergone the processing beginning with the below-described Step 2530, and has the largest; number of remaining erasures 1155. When the block managed by the record selected here (hereinafter referred to as a "selected block") is changed to the TLC mode, the number of remaining erasures decreases. When the remaining erasable count of the selected block is small, this block will reach the end of its lifetime soon. Accordingly, the cell mode modification program 242 performs selection beginning with the block having the greatest number of remaining erasures.

The cell mode modification program 242 may calculate the logical capacity of the SSD 21 on the basis of the assumption that the blocks managed by the record selected in Step 2520 were changed to the TLC mode. The calculation may be performed in accordance with the following description.

The cell mode modification program 242 may calculate a value obtained by subtracting 1 from the number of records among the records of the block management table 1150 in which the mode 1154 is "0." Hereinafter, this value may be expressed as "m." In addition, the cell mode modification program 242 may calculate a value obtained by adding 1 to the number of records among the records of the block management table 1150 in which the mode 1154 is "1." Hereinafter, this value may be expressed as "m." Assuming that the block managed by the record selected in Step 2520 (that is, one block) is changed to the TLC mode, the values "m" and "t" may represent the number of blocks in the MLC mode and the number of blocks in the TLC mode in the SSD 21, respectively.

Next, the cell mode modification program 242 may obtain the logical capacity of the SSD 21 after changing the cell mode by calculating m×the size of the blocks in the MLC mode+t×the size of the blocks in the MLC mode.

If the logical capacity obtained here for the SSD 21 after the cell mode modification is less than the capacity information acquired in Step 2510 (Step 2530: YES), then Step 2540 may be performed. Conversely, if the logical capacity of the SSD 21 after the cell mode modification is greater than or equal to the capacity information acquired in Step 2510 (Step 2530: NO), the cell mode modification program 242 may skip the processing of Step 2540 to Step 2550, and proceed to perform Step 2560.

Step 2540: The cell mode modification program 242 may issue an instruction to the FM chip 210 to modify the cell mode of the blocks 211 managed by the record selected in the Step 2520, and cause the block 211 to change to the TLC mode. Subsequently, the cell mode modification program 242 may modify the mode 11540 of the record (the record selected in Step 2520) of the block management table 1150 to "1," and modify the number of remaining erasures 1155 (by multiplying by 0.1).

Step 2550: The cell mode modification program 242 may determine whether there are unprocessed records (records for which the processes of Step 2520, Step 2530, etc. are have not been performed) in the block management table 1150. In the event that there is an unprocessed record (Step 2550: YES), the cell mode modification program 242 may once again perform the process of Step 2520. In the event that there are no unprocessed records (Step 2550: NO), then Step 2560 may be performed.

Step 2560: The cell mode modification program 242 may notify the DKC 10 that processing has completed, and end the process. At this time, the cell mode modification program 242 may notify the DKC 10 of the modified logical capacity of the SSD 21.

Upon completion (in response to receiving a processing completion response from all SSDs 21 belonging to RG # n) of Step 14 (the processing of FIG. 12), the cell mode control program 142 may store the logical capacity of the SSD 21 returned from the SSD 21 in the RAID group management table 650 (logical capacity 654), store the current date (time) in the last execution date 660, and end the process.

This concludes the description of the processing performed in the storage system of the present embodiment. In the storage system of the present embodiment, the lifetime of the SSD 21 is predicted from the rate of change of the number of remaining erasures of the SSD 21, and when the predicted lifetime is larger than a predetermined value (service life), the mode of a portion of the blocks (cells) may be changed from the MLC mode to the TLC mode to increase the storage capacity of the SSD 21. In particular, the storage controller may calculate the number of remaining erasures of the SSD 21 that will satisfy the target life (the target number of remaining erasures). When the number of remaining erasures of the SSD 21 is changed to the target number of remaining erasures, the SSD 21 may determine how many blocks can be operated in the TLC mode, and change the cell mode for the determined number of blocks. In this way, the storage system can provide a larger storage capacity to the user while maintaining the lifetime (service life) of the SSD 21.

Embodiment 2

Next, the storage apparatus according to Embodiment 2 will be described. Since the hardware configuration of the storage apparatus according to Embodiment 2 is the same as that of the storage apparatus according to Embodiment 1, illustration in the Figures is omitted. In addition, in the following description, when identifying the same components described in Embodiment 1, the same reference numerals used in Embodiment 1 will be used.

In Embodiment 1, an example of the processing in the case of increasing the storage capacity of the SSD 21, that is, an example of changing the mode of a portion of cells from the MLC mode to the TLC mode, was described. However, reverse processing (processing to change the mode of a portion of cells from the TLC mode to the MLC mode) may also be performed.

The process described in Embodiment 1 is a process that is beneficial to be performed in the case that it is determined that the predicted lifetime value of the SSD 21 is longer than the anticipated service life. However, in practice, the opposite case; that is, a case where the predicted lifetime value of the SSD 21 is shorter than the anticipated service life, can also arise. In Embodiment 2, the processing to be performed by the storage apparatus in such a case will be described.

Figure 7:
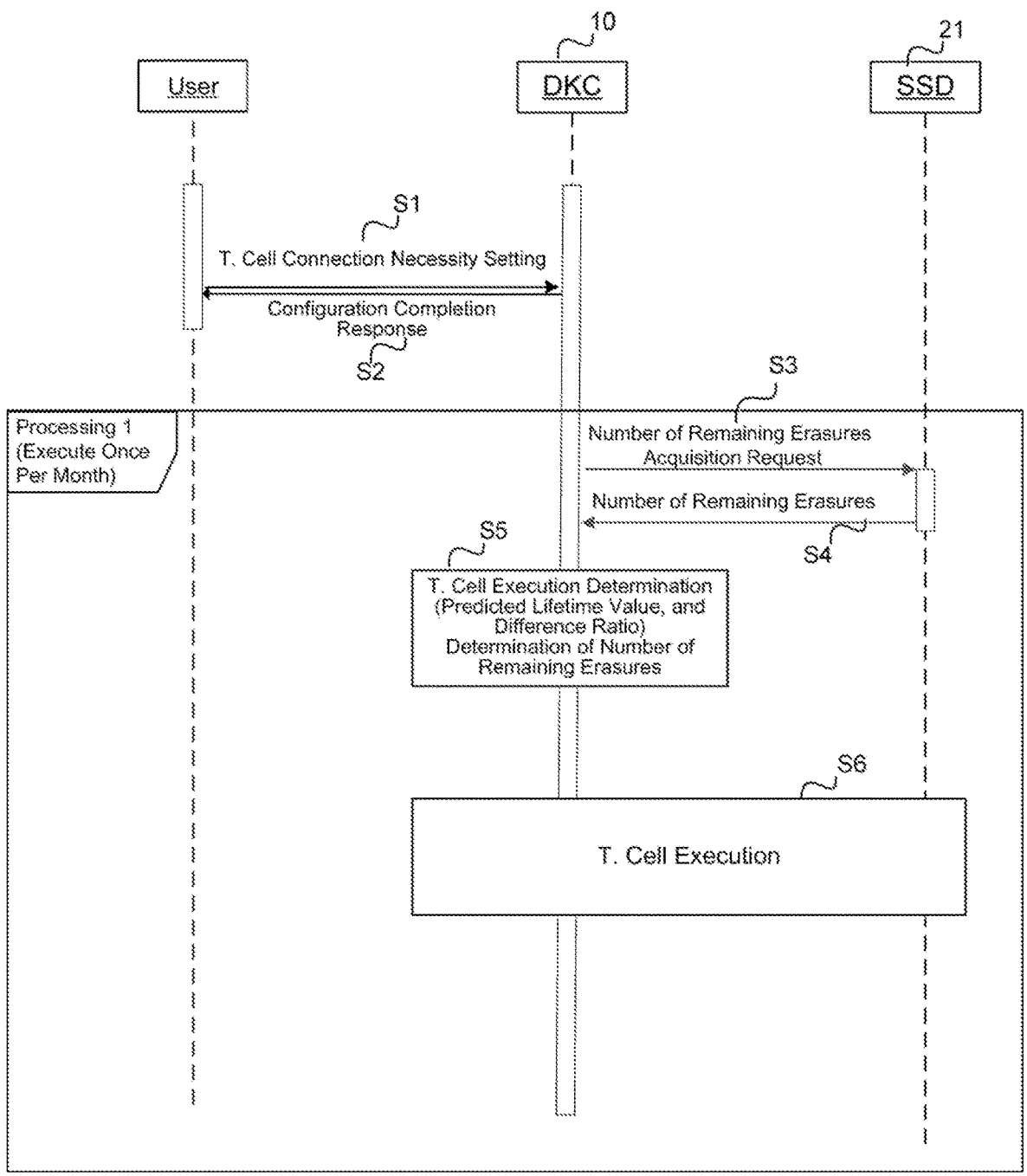
FIG. 7 is a diagram for explaining an overall flow of processing.

The overall flow of the processing performed by the storage apparatus according to Embodiment 2 is the same as that described in Embodiment 1 (FIG. 7). However, a portion of the processing performed in Step 5 described in Embodiment 1 (FIG. 7) is modified. The flow of the determination processing for the cell mode modification necessity that is performed in the storage apparatus according to Embodiment 2 will be described with reference to FIG. 15.

Figure 15:
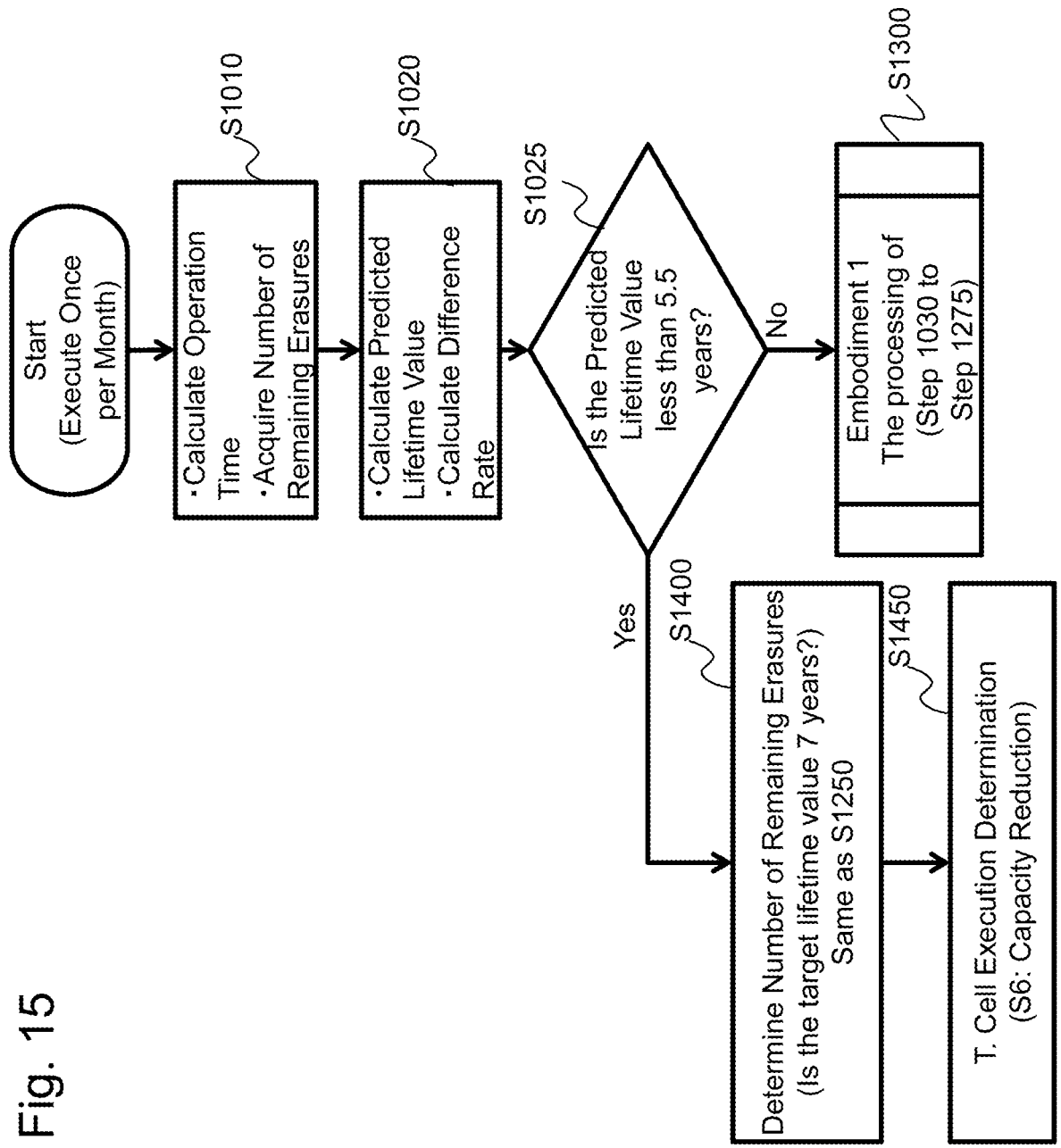
FIG. 15 is a flowchart of a cell mode modification necessity determination process according to Embodiment 2.

The processing illustrated in FIG. 15 is similar to the processing of FIG. 8 and FIG. 9 described in Embodiment 1. Hereinafter, the aspects different from those of FIG. 8 and FIG. 9 will primarily be described. In addition, similarly to Embodiment 1, each step described below is a process performed for each SSD 21 in a specific RAID group (denoted as RG # n).

Since Steps 1010 and 1020 are the same as the Steps 1010 and 1020 described in Embodiment 1, the description thereof will be omitted.

Step 1025: The cell mode control program 142 determines whether the predicted lifetime values of each SSD 21 in RG # n calculated in Step 1020 are less than 5.5 years from the operation start date. In the case that the predicted lifetime value of at least one SSD 21 among the SSDs 21 in RG # n is less than 5.5 years from the operation start date (Step 1025: Yes), then Step 1400 is performed. If the predicted lifetime values of all the SSDs 21 in the RG # n are 5.5 years or more from the operation start date (Step 1025: No), the processing from Step 1030 onward in Embodiment 1 (FIG. 8) is performed (Step 1300). Since the processing performed in Step 1300 is the same as the processing in Steps 1030 to 1275 described in Embodiment 1, the description herein will be omitted.

Step 1400: The cell mode control program 142 determines the number of remaining erasures of each SSD 21 in RG # n. The processing performed here is similar to the processing performed in Step 1250 and Step 1090 of Embodiment 1. It should be noted that, in Embodiment 1, the predicted lifetime value of the SSD 21 when the logical capacity was increased was referred to as a "target lifetime," and the number of remaining erasures at that time was referred to as the "target number of remaining erasures." In contrast, in Embodiment 2, however, the predicted lifetime value of the SSD 21 is referred to as the "target lifetime" not only in the case where the logical capacity is increased, but also when the logical capacity is reduced, and the number of remaining erasures is referred to as the "target number of remaining erasures."

In Step 1400, the cell mode control program 142 obtains the target number of remaining erasures, assuming that the target lifetime of each SSD 21 in RG # n is seven years from the operation start date. The method of calculating the target number of remaining erasures is the same as the method described in Embodiment 1.

Step 1450: The processing here is the same processing as that of Step 1100 of Embodiment 1. The cell mode control program 142 stores the number of remaining erasures and the predicted lifetime value of each SSD 21 in the RAID group management table 650, and then executes step 6 (the cell mode modification process).

However, the cell mode modification process in Embodiment 2 is different from the processing described in Embodiment 1 in that cells in the TLC mode may be changed to the MLC mode. Hereinafter, the cell mode modification process in Embodiment 2 will be described.

Figure 16:
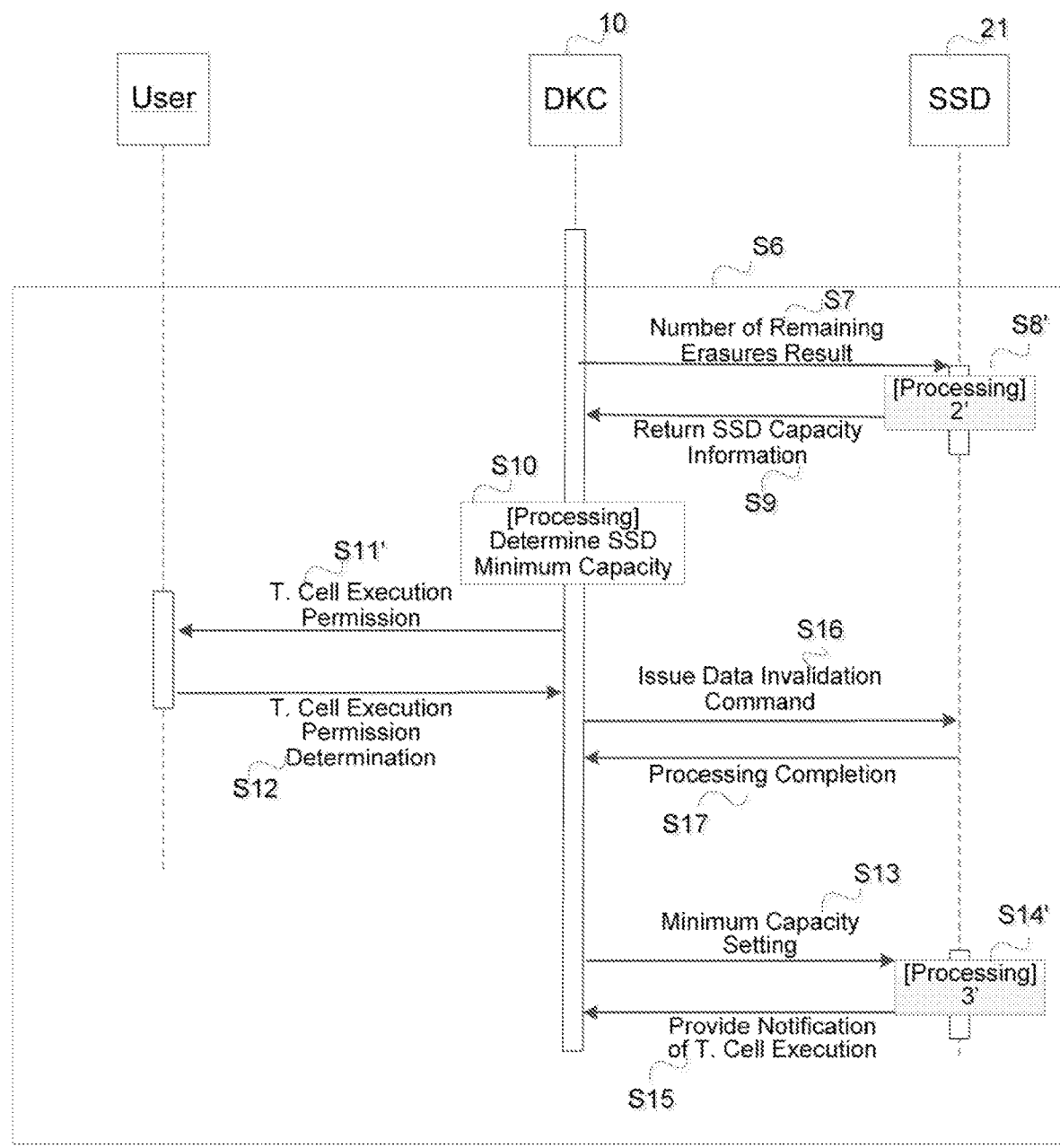
FIG. 16 is a flowchart of a cell mode modification necessity determination process according to Embodiment 2.

First, with reference to FIG. 16, the outline of the processing of Step 6 in Embodiment 2 will be described. The cell mode control program 142 issues a capacity verification command to each SSD 21 belonging to RG # n (Step 7). The processing of Step 7 is the same as that described in Embodiment 1.

In contrast, upon receiving the capacity verification command, the number of blocks 211 that can be changed from the MLC mode to the TLC mode, or alternatively, the number of blocks 211 that can be changed from the TLC mode to the MLC mode, is obtained using the information regarding the number of remaining erasures included in the command. Further, based on this, the logical capacity in the case that the cell mode of the obtained number of blocks 211 is changed is calculated (Step 8'). Then, the SSD 21 returns the calculated logical capacity to the storage controller 10 (Step 9). In Step 8', the SSD 21 may have to determine the number of blocks 211 that can be changed from the TLC mode to the MLC mode. Accordingly, the processing performed in Step 8' differs from Step 8 in Embodiment 1. The detailed processing of Step 8' will be described later.

Figure 17:
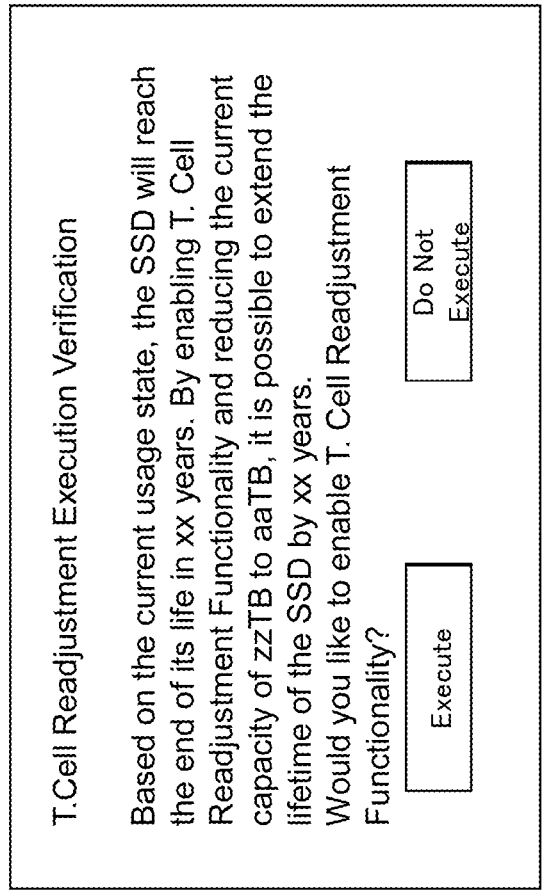
FIG. 17 is an example of a verification screen.

After the logical capacities are returned from each SSD 21, the cell mode control program 142 determines the minimum capacity of the SSDs 21 belonging to RG # n (Step 10). This process is the same as the process described in Embodiment 1. Subsequently, the cell mode control program 142 verifies the cell mode modification permission with a user (Step 11'). In Step 11', the cell mode control program 142 performs a process of verifying with the user whether or not to approve the cell mode modification. In the case of increasing the capacity of the SSD 21 as a result of the processing leading up to Step 10, the cell mode control program 142 causes the management host 5 to display the verification screen illustrated in FIG. 14 on the display of the management host 5. In contrast, when it is necessary to reduce the capacity of the SSD 21, the cell mode control program 142 causes the management host 5 to display the verification screen illustrated in FIG. 17 on the display of the management host 5 to verify with the user whether or not to approve reduction of the capacity of the SSD 21.

In the case that it is necessary to reduce the capacity of the SSD 21 after the user presses the "execute" button of these verification screens, the management host 5 calculates a value for each SSD 21 by subtracting the minimum capacity of the SSD 21 determined in Step 10 from the capacity of the current SSD 21, and calculates the amount of data by which each SSD 21 will be reduced. Next, the LBA range corresponding to the data amount calculated for each SSD 21 is designated, and a data invalidation command is issued (Step 16). The SSD 21 transitions the pages mapped to the designated LBA to the invalid pages, updates the number of invalid pages 1157 and the block state 1158 of the block management table 1150 of the SSD 21, and responds to the management host 5 (Step 17). Subsequently, the management host 5 returns to the cell mode control program 142 the indication that the capacity reduction of the SSD 21 has been approved (Step 12). This is the same as Step 12 of Embodiment 1.

When the user permits modification of the cell mode, the cell mode control program 142 issues a cell mode modification command to each SSD 21 belonging to RG # n (Step 13). Step 13 is the same as Step 13 of Embodiment 1.

The cell mode modification command includes capacity information. In response to receiving this command, the SSD 21 changes the cell mode of some of the blocks in the SSD 21 from the MLC mode to the TLC mode (or alternatively, from the TLC mode to the MLC mode) by using the capacity information included in the command (Step 14'). After Step 14', the SSD 21 notifies the DKC 10 that the cell mode modification has been completed (Step 15). Similarly to Step 8', a portion of the processing of Step 14' is different from the Step 14 described in Embodiment 1. A detailed description will be provided later.

Upon completion of Step 15 (in response to receiving a response indicating completion of processing from all the SSDs 21 belonging to RG # n), the cell mode control program 142 stores the logical capacity of the SSDs 21 returned from the SSDs 21 in the RAID group management table 650 (logical capacity 654), stores the current date (time) in the last execution date 660, and ends the processing.

Figure 18:
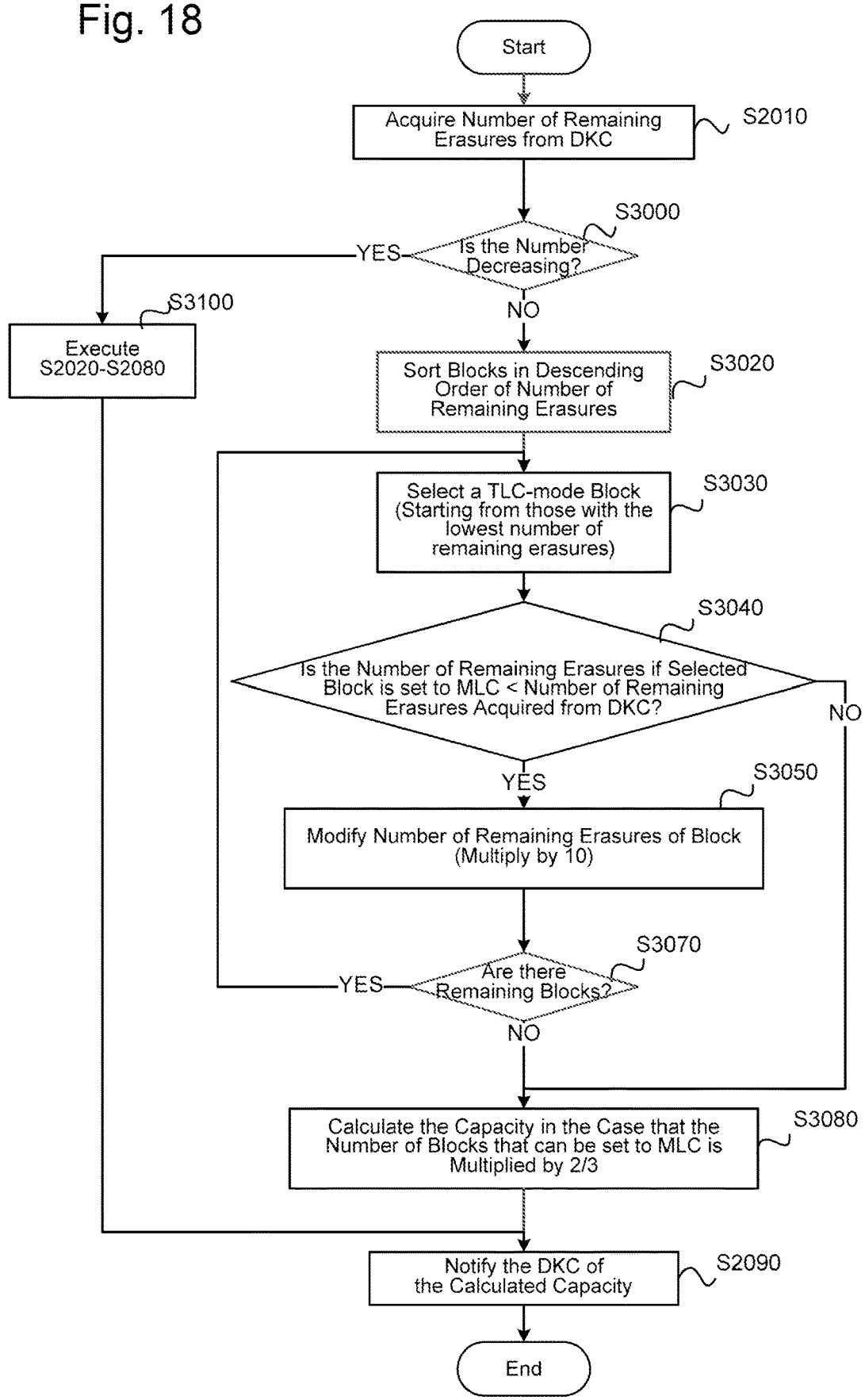
FIG. 18 is a flowchart of a process performed when an SSD according to Embodiment 2 receives a capacity verification command.

With reference to FIG. 18, the flow of processing executed by the SSD 21 in Step 8' will be described. The processing in FIG. 18 is performed by the cell mode modification program 242 of the SSDs 21. It should be noted that, in Embodiment 1, an example was described in which, when the number of remaining erasures (the number of remaining erasures 1155 stored in the block management table 1150) of a block in the MLC mode is n (where n is an integer greater than or equal to 0), and that block is changed to the TLC mode, the number of remaining erasures of the block becomes n/c.

The same assumptions will be used in Embodiment 2 as well. Also, in contrast, when a block in the TLC mode is changed to the MLC mode, it is assumed that the number of remaining erasures of the block becomes a multiple of c. In the following description, unless otherwise specified, an example in the case of c=10 will be described.

Step 2010: This process is the same as Step 2010 of Embodiment 1 (FIG. 11). The cell mode modification program 242 extracts information regarding the number of remaining erasures included in the capacity verification command received from the DKC 10.

Step 3000: The cell mode modification program 242 refers to the block management table 1150, obtains the number of remaining erasures of the SSD 21 (the total number of remaining erasures of all the blocks), and compares it with the information regarding the number of remaining erasures received in Step 2010. In the case that the number of remaining erasures received in Step 2010 is less than the number of remaining erasures of the SSD 21 (Step 3000: YES), the cell mode modification program 242 executes Steps 2020 to 2080 described in Embodiment 1 (FIG. 11) (Step 3100). Conversely, when the number of remaining erasures received in Step 2010 is greater than or equal to the number of remaining erasures of the SSD 21 (Step 3000: NO), the cell mode modification program 242 subsequently executes Step 3020.

As Step 3100 (that is, Steps 2020 to 2080) is the same as the processing described in Embodiment 1, the description thereof will be omitted herein. After Step 3100, the cell mode modification program 242 executes Step 2090 and ends the processing. Step 2090 is also the same as that described in Embodiment 1.

Step 3020: The cell mode modification program 242 creates a copy of the block management table 1150. Here, the created copy of the block management table 1150 is referred to as a "duplicate table." Also, in the following description, similarly to the block management table 1150, the columns of the duplicate table are referred to as chip #1151, die #1152, block #1153, mode 1154, and number of remaining erasures 1155. Next, the cell mode modification program 242 sorts the records in the duplicate table in descending order based on the number of remaining erasures 1155.

Step 3030: The cell mode modification program 242 selects one record from the duplicate table. The record selected here is the record having the smallest number of remaining erasures 1155 among those records for which the processing of Step 3040 and subsequent steps described below has not been performed and for which the mode 1154 is "1." In other words, the record for the block having the smallest number of remaining erasures is selected from among the TLC mode blocks.

Step 3040: The cell mode modification program 242 calculates the number of remaining erasures of the SSD 21 based on the contents of the duplication table. At this time, the cell mode modification program 242 calculates the number of remaining erasures of the SSD 21 under the assumption that the blocks managed by the record selected in Step 3030 have been changed from the TLC mode to the MLC mode. In particular, the calculation is performed according to the following procedure (a calculation similar to the calculation method described in Step 2040 of Embodiment 1 is performed).

First, the cell mode modification program 242 calculates the total value of the number of remaining erasures 1155 of all the records in the duplicate table excluding the record selected in Step 3030. Subsequently, the cell mode modification program 242 calculates a value obtained by multiplying the number of remaining erasures of the record selected in Step 3030 by 10. The cell mode modification program 242 acids the value calculated here to the total value of the number of remaining erasures 1155 calculated earlier in order to calculate the number of remaining erasures of the SSD 21 in the case that the cell mode of a portion of the blocks is changed.

In the case that the number of remaining erasures of the SSD 21 calculated here is less than the number of remaining erasures received in Step 2010 (Step 3040: YES), the cell mode modification program 242 next performs Step 3050. In the case that the calculated number of remaining erasures of the SSD 21 is equal to or greater than the number of remaining erasures received in Step 2010 (Step 3040: NO), the cell mode modification program 242 skips the processing of Step 3050 to Step 3070, and next performs Step 3080.

Step 3050: The cell mode modification program 242 modifies (multiplies by 10) the number of remaining erasures 1155 of the record selected in Step 3030 and changes the mode 1154 of this record to "1."

Step 3070: The cell mode modification program 242 determines whether or not there are any unprocessed records (records for which the processes of Step 3030, Step 3040, and the like have not been performed) in the duplicate table. In the case that there is an unprocessed record (Step 3070: YES), the cell mode modification program 242 once again performs the process of Step 3030. If there are no unprocessed records (Step 3070: NO), then Step 3080 is performed.

Step 3080: The cell mode modification program 242 calculates the logical capacity of the SSD 21 in the case that several blocks were to be changed to the TLC mode. Since the calculation method is the same as the method performed in Step 2080 of Embodiment 1, the description thereof will be omitted here.

After completion of Step 3080 or Step 3100, the cell mode modification program 242 notifies the DKC 10 of the logical capacity of the SSD 21 calculated in Step 3080 (or Step 3100), discards the duplication table, and ends processing.

Figure 19:
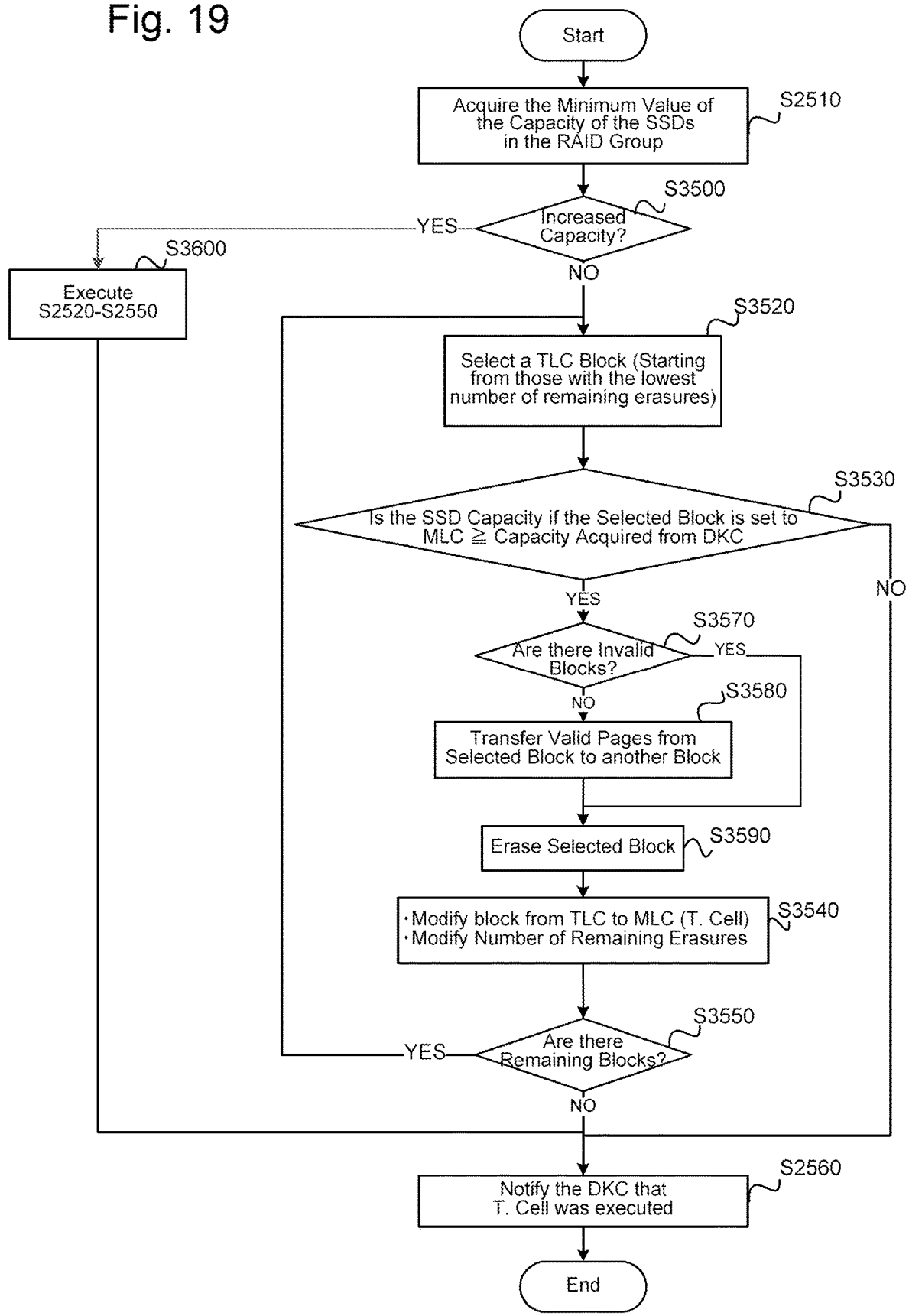
FIG. 19 is a flowchart of a process performed when an SSD according to Embodiment 2 receives a cell mode modification command.

Next, the details of the processing of Step 14' will be described with reference to the flowchart illustrated in FIG. 19. In the flowchart of FIG. 19, processing for modifying the cell mode of blocks in the TLC mode has been added to the flowchart of FIG. 12, and a portion of the processing is the same as in FIG. 12. The differences therein will be primarily described below.

Step 2510: This process is the same as that of Step 2510 described in Embodiment 1.

Step 3500: The cell mode modification program 242 calculates the logical capacity of the SSD 21 at the present point in time based on the contents of the block management table 1150. Since the calculation method is the same as the method described in Step 3080 (or Step 2080 in Embodiment 1), the description thereof will be omitted here. In the case that the capacity received from the DKC 10 (included in the cell mode modification command) is larger than the logical capacity calculated here (Step 3500: YES), then this means that the DKC 10 is instructing the SSD 21 to expand the logical capacity of the SSD 21 (modify the mode of a portion of the blocks to the TLC mode). In this case, the cell mode modification program 242 subsequently executes Steps 2520 to 2550 described in Embodiment 1 (Step 3600). Conversely, in the case that the capacity received from the DKC 10 (included in the cell mode modification command) is less than or equal to the logical capacity calculated here (Step 3500: NO), then Step 3520 is performed.

Since Step 3600 (Step 2520 to Step 2550) has already been described in Embodiment 1, the explanation thereof will be omitted here. After Step 3600, the cell mode modification program 242 executes Step 2560 and ends processing. Step 2560 is also the same as that described in Embodiment 1.

Step 3520: The cell mode modification program 242 selects one record from the block management table 1150. The record selected here is the record having the smallest number of remaining erasures 1155 among those records for which the processing of Step 3040 and beyond has not been performed and for which the mode 1154 is "1." In other words, the record for the block having the smallest number of remaining erasures is selected from among the TLC mode blocks. It can be said that there is a high probability that the block in the TLC mode that has the smallest number of remaining erasures has the shortest lifetime. Since the capacity of the SSD 21 substantially decreases when a block that reaches the end of its lifetime occurs in the SSD 21, is desirable that the SSD 21 be controlled to limit the occurrence of blocks reaching the end of their lifetimes as much as possible. Accordingly, here, the cell mode modification program 242 preferentially selects the block having the smallest number of remaining erasures from among the blocks in the TLC mode, and changes the block to the MLC mode, thereby lengthening the lifetime of the block.

Step 3530: The cell mode modification program 242 calculates the logical capacity of the SSD 21 under the assumption that the blocks managed by the record selected in Step 3520 are changed to the MLC mode. The calculation method is similar to that of Step 2530 of Embodiment 1.

The cell mode modification program 212 calculates a value obtained by subtracting 1 from the number of records having a mode 1154 of "1" in the records of the block management table 1150. Hereinafter, this value is expressed as "t." In addition, the cell mode modification program 242 calculates a value obtained by adding 1 to the number of records having a mode 1154 of "0" in the records of the block management table 1150. Hereinafter, this value is expressed as "m." "m" and "t" are the respective number of blocks in the MLC mode and the number of blocks in the TLC mode in the SSD 21 in the case that it is assumed that the blocks managed by the record selected in Step 2520 are modified to the MLC mode.

Then, the cell, mode change program 242 calculates the post-mode change logical capacity of the SSD 21 by calculating:

$$m \times \text{the size of the blocks in the MLC mode} + t \times \text{the size of the blocks in the TLC mode.}$$

In the case that the post-mode change logical capacity of the SSD 21 obtained here is larger than the capacity information acquired in Step 2510 (Step 3530: YES), then Step 3570 is performed. On the other hand, in the case that the post-mode change logical capacity of the SSD 21 is less than or equal to the capacity information acquired in Step 2510 (Step 3530: NO), then the cell mode modification program 242 skips the processing of Steps 3540 to 3550, and next performs Step 2560. In Step 3570, in the case that the block state of the block 211 managed by the record selected in Step 3520 is an invalid block (Step 3570: YES), then in Step 3590, the block 211 managed by the record selected in Step 3520 is deleted, and Step 3540 is performed next. In the case that the block state of the block 211 managed by the record selected in Step 3520 is something other than an invalid block (Step 3570: NO), after moving the valid pages in the block 211 managed by the record selected in Step 3520 to another block in Step 3580, then in Step 3590, the block 211 managed by the record selected in Step 3520 is deleted, and Step 3540 is performed next.

Step 3540: The cell mode modification program 242 issues, to the FM chip 210, an instruction to change the cell mode of the block 211 managed by the record selected in Step 3520, and changes that block 211 to the MLC mode. Subsequently, the cell mode modification program 242 changes the mode 1154 of the record (the record selected in Step 3520) of the block management table 1150 to "0," and modifies the number of remaining erasures 1155 (multiplies it by 10).

Step 3550: The cell mode modification program 242 determines whether or not there are any unprocessed records (records for which the processes of Step 3520, Step 3530, and the like have not been performed) in the block management table 1150. In the case that there is an unprocessed record (Step 3550: YES), the cell mode modification program 242 again performs the process of Step 3520. If there are no unprocessed records (Step 3550: NO), then Step 2560 is performed. Since the processing performed in Step 2560 is the same as that described in Embodiment 1, the description here is omitted.

Since the above-described processing is performed in the storage apparatus according to Embodiment 2, even in cases where an unexpected increase in access load occurs after the cell mode of many of the blocks of the SSD 21 have been changed to the TLC mode, for example, the lifetime can be prevented from becoming shorter.

Embodiment 3

Subsequently, the storage apparatus according to Embodiment 3 will be described. Since the hardware configuration of the storage apparatus according to Embodiment 3 is the same as that of the storage apparatus according to Embodiment 1 or Embodiment 2, illustration thereof is omitted here. In addition, in the following description, when identifying the same components described in Embodiment 1 or Embodiment 2, the same reference numerals used in Embodiment 1 or Embodiment 2 will be used.

As described above, the storage apparatus according to Embodiment 1 or Embodiment 2 can expand its logical capacity by changing a portion of the blocks of the SSD 21 from the MLC mode to the TLC mode when predetermined conditions are satisfied. However, the storage apparatus according to Embodiment 1 or Embodiment 2 determines whether or not the logical capacity can be expanded after a certain period of time has elapsed since the start of use of the SSD 21 (for example, after six months or more in the case of Embodiment 1). This is because, until a period of time elapses after the start of operation and the access tendency to the SSD 21 stabilizes, the predicted lifetime value greatly fluctuates, and there are times when the lifetime cannot be accurately predicted. Accordingly, the user has to wait for a certain period (for example, approximately six months) before the logical capacity of the SSD 21 is expanded. In Embodiment 3, an example of a method will be described for enabling immediate expansion of the logical capacity by predicting the lifetime using information already possessed by the storage apparatus.

First, the management information possessed by the storage apparatus 1 according to Embodiment 3 will be described. FIG. 20 illustrates a configuration example of the RAID group management table 650' included in the storage apparatus 1 according to Embodiment 3. Similarly to the RAID group management table 650 described in Embodiment 1, the RAID group management table 650' is a table for managing the RAID group managed by the storage apparatus 1 and the attribute information of the storage devices belonging to the RAID group, and is stored in the memory 14. The RAID group management table 650' has at least the columns possessed by the RAID group management table 650 (RG # 651 to the last execution date 660). In FIG. 20, however, the description of some of the columns is omitted.

Further, the RAID group management table 650' has columns including physical capacity 661, compression rate 662, total write amount 663, random write ratio 664, total erasure count 665, and WAF 666. However, information other than this may also be stored in the RAID group management table 650'.

The physical capacity 661 is a column for storing the physical capacity of the storage device. In Embodiment 3, in the case that the storage device is the SSD 21, for example, the "physical capacity" is the total capacity of all the blocks 211 of the SSD 21. Generally, storage devices have more physical capacity than logical capacity (the size of the logical address space provided to the DKC 10). When the storage device is installed in the storage apparatus 1, the DKC 10 issues a request to the storage device to query for the physical capacity, and stores the value of the physical capacity obtained by this query in the physical capacity 661.

In the case that the storage device has a function for compressing and storing data (hereinafter referred to as a "compression function") the data compression rate is recorded in compression rate 662. The compression ratio is a value obtained by: (the amount of the storage medium used to store compressed data in the storage device)÷the amount of data written from the DKC 10 (uncompressed data). This information is also acquired from the storage device by the DKC 10 issuing a request to the storage device to query for the compression ratio. It should be noted that, in the case that the storage device does not have a compression function, "1" is stored in the compression rate 662.

The total write amount 663 is the sum of the amount of data written from the DKC 10 to the storage device since the operation start date of the storage device. Each time the DKC 10 issues a write request to each storage device, it updates the value of the total write amount 663.

The random write ratio 664 is a value indicating the ratio of the write requests issued to the storage device from the DKC 10 that are occupied by random write requests. In particular, the random write ratio 664 is a value obtained by the following equation:

Number of random write requests÷(Number of sequential write requests+Number of random write requests).

Each time the DKC 10 issues a write request to each storage device, it updates the value of the total write amount 663. Also, the DKC 10 determines whether the write request issued to the storage device is a sequential write request or a random write request based on a predetermined algorithm. For example, when a plurality of write requests are issued to the storage device, if the write destination addresses of the respective write requests are consecutive addresses, then the DKC 10 determines that these write requests are sequential write requests.

The total erasure count 665 is the sum total of the erasure counts performed for each block in the storage device since the operation start date of the storage device. The DKC 10 obtains the total erasure count from the storage device by issuing a request to the storage device to acquire the total erasure count, and stores this in the total erasure count 665. However, there are cases in which the storage device does not have a function for notifying the total erasure count to the DKC 10 (for example, since storage devices such as the HDD 25 do not manage the erasure count, they do not have a function for notifying the erasure count). In this case, a value is not stored in the total erasure count 665.

WAF 666 is a column for storing information regarding what is known as Write Amplification (WA). In storage devices that use flash memory as a storage medium, there is a tendency for the amount of data written in the storage medium (the FM chip) in the storage device to be larger than the amount of write data externally received (from initiators like the DKC 10) by the storage device. This phenomenon is called Write Amplification (WA). Also, as an index value representing the tendency of WA, the value defined by the following equation is used: the amount of data written to the FM chip÷the amount of data externally written to the storage device. In this embodiment, this value is the called Write Amplification Factor (WAF).

A larger WAF indicates that the amount of data written to the FM chip is larger than the amount of data written externally to the storage device, and as a result, there is a tendency for the erasure count in the storage device to increase (it can also be said that it has a tendency to be short-lived). The WAF stored in the WAF 666 may be a WAF acquired from the storage device, or alternatively, a WAF calculated based on the information (the random write ratio, the compression ratio, etc.) regarding the access tendency of the DKC 10 with respect to the storage device may be stored. For example, in the case that the storage device does not have a function for providing the WAF, the DKC 10 may calculate the WAF of the storage device using a predetermined calculation formula (function).

Next, an overview of a logical capacity expansion method in the storage apparatus according to Embodiment 3 will be described. In particular, in Embodiment 3, a case of replacing the storage device will be described as an example. An example of exchanging (replacing) a particular storage device (this will be referred to as "device A") of the storage apparatus 1 with a new storage device (this will be referred to as "device B") will be considered. There are several cases (reasons) in which such an exchange could be made; for example, there are cases such as when a predetermined number of years (service life) have elapsed since the start of using the device A. In this case, since the device B is a storage device that has not yet been used, there is no information regarding the access tendency to the device B or the like, but information such as the access tendency of device A exists (the DKC 10 records it in the RAID group management table 650'). The storage apparatus 1 according to Embodiment 3 estimates the rate of change of the number of remaining erasures of device B by using the information such as the access tendency of device A, and based on this, determines the logical capacity of device B. With regard to the method of determining the logical capacity, the same method as described in Embodiment 1 can be used, for example.

In Embodiment 3, the storage device newly installed in the storage apparatus 1 as a result of the replacement is assumed to be the SSD 21 described in Embodiment 1 (or Embodiment 2). That is, as described in Embodiment 1 and the like, the newly installed SSD 21 has a function for returning a logical capacity that satisfies the conditions of the target number of remaining erasures in response to receiving the capacity verification command (including the target number of remaining erasures) from the DKC 10, and a function for modifying the capacity of the storage device to the capacity included in the cell mode modification command by changing a portion of the blocks from the MLC mode to the TLC mode (or the TLC mode to the MLC mode) in response to receiving a cell mode modification command from the DKC 10. Accordingly, once the target number of remaining erasures is determined, the logical capacity can be expanded (or reduced) accordingly.

It should be noted that, in the following, an example will be described in which one storage device among the storage devices in the storage apparatus 1 is replaced with one new storage device (SSD 21). In addition, the storage device that is mounted in the storage apparatus 1 prior to replacement and is the target storage device to be replaced is referred to as the "old device," and the storage device (SSD 21) to be newly mounted (or that has been mounted) in the storage apparatus 1 is referred to as the "new device."

Figure 21:
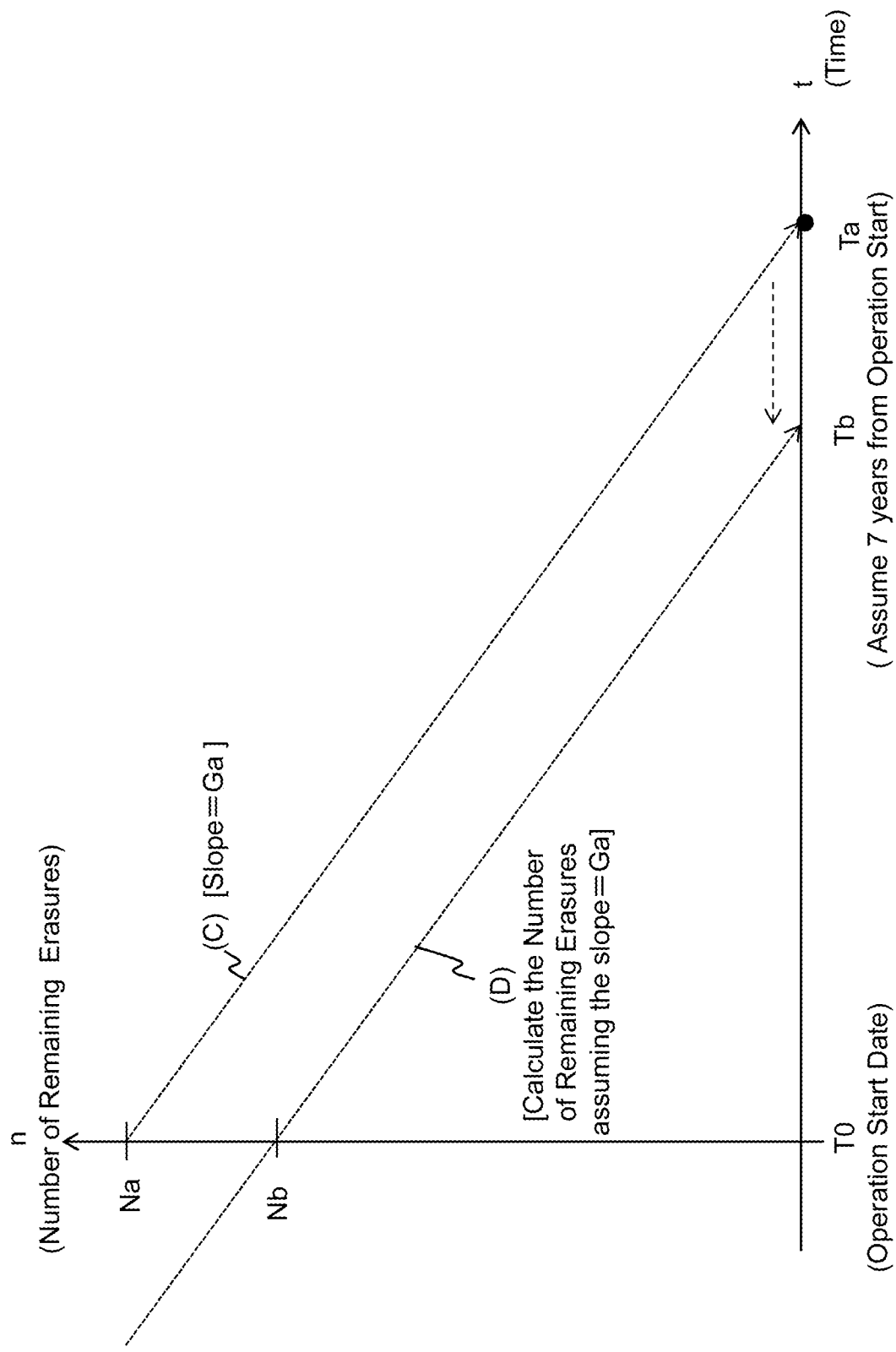
FIG. 21 is a diagram for explaining a determination method of the target number of remaining erasures according to Embodiment 3.

An overview of the method for determining the target number of remaining erasures will be described with reference to FIG. 21. Similarly to FIG. 10, FIG. 21 is a graph expressing the relationship between the number of remaining erasures and the operation date. In the storage apparatus 1 according to Embodiment 3, the DKC 10 estimates the rate of change of the number of remaining erasures of the new device based on information such as the access tendency of the old device. In Embodiment 3, the rate of change of the number of remaining erasures is denoted as "Ga." The calculation method of Ga will be described later. Also, the number of remaining erasures at the start of use of the new device (immediately after being installed in the storage apparatus 1) is expressed as "Na" (referred to as the initial value of the number of remaining erasures). Assuming that the number of remaining erasures of the new device decreases at the rate of change Ga, when the relationship between the number of remaining erasures and the operation date is represented on a graph, the straight line (C) in FIG. 21 is obtained. Among the points on the straight line (C), the time ("Ta" in FIG. 21) at the point when the number of remaining erasures becomes 0 is the predicted lifetime value at the start of use of the new device. In the figure, "T0" represents the operation start date of the SSD 21. In this case, the predicted lifetime value Ta is represented by the following Expression 5.

[Formula 5]

$$Ta = -\frac{Na}{Ga} + T0 \qquad (5)$$

If Ta (more precisely (Ta−T 0)) is sufficiently larger than the service life of the SSD 21 (assumed to be 5 years, as in Embodiment 1), then the DKC 10 extends the logical capacity by reducing the number of remaining erasures (or the predicted lifetime value). For example, the DKC 10 obtains the number of remaining erasures (the target number of remaining erasures) when the target lifetime value is Tb (where. Ta>Tb).

The method of calculating the target number of remaining erasures is the same as the method performed in Embodiment 1 (for example, Step 1090 in FIG. 10). The straight line (D) in FIG. 21 is a graph illustrating the relationship between the number of remaining erasures and the operation date, assuming that the target lifetime value is Tb and the number of remaining erasures is decreasing at the change rate Ga. Since the target number of remaining erasures is a point on the straight line (D) and is also the point ("Nb" in the Figures) when the date and time is T0 (the operation start date), it can be obtained using the following Expression 6.

[Formula 6]

$$Nb = Ga \times (T0 - Tb) \qquad (6)$$

Next, an example of the calculation method of the rate of change (Ga) will be described. In the following, it is assumed that the old device is a storage device that uses flash memory as a storage medium. In addition, the erasure count per unit time (for example, the erasure count per month), WAF, logical capacity, physical capacity, and amount of writes per unit time of the old device are respectively denoted as "$E_{old}$," "$WAF_{old}$," "$CL_{old}$," "$CP_{old}$," and "$WR_{old}$," and the (predicted) erasure count per unit time, (predicted) WAF, logical capacity, physical capacity, and (predicted) amount of writes per unit time of the new device are respectively denoted as "$E_{new}$," "$WAF_{new}$," "$CL_{new}$," "$CP_{new}$," and "$WR_{new}$." It should be noted that the "amount of writes per unit time" here refers to the amount of data written from the DKC 10 to the storage device per unit time (for example one month).

In Embodiment 3, a case in which there is no access locality (the DKC 10 equally issues write requests to each area of the logical address space that the storage device provides to the DKC 10) is assumed as the access characteristic (in particular, a write characteristic) from the DKC 10 to the storage device.

The number of erasure processes (the erasure count of the storage device) performed in the storage device (SSD) is correlated with the amount of writes (if the amount of writes is large, the erasure count also increases). In addition, the erasure count of the storage device also depends on the physical capacity. In particular, if the physical capacity is large, the erasure count decreases. Accordingly, in consideration of these relationships, the storage apparatus 1 according to Embodiment 3 assumes that the erasure count per unit time of a new device ($E_{new}$) is obtained by the following Expression 7, and calculates $E_{new}$.

[Formula 7]

$$E_{new} = E_{old} \times \frac{WAF_{new}}{WAF_{old}} \times \frac{WR_{new}}{WR_{old}} \times \frac{CP_{old}}{CP_{new}} \quad (7)$$

However, in cases in which $E_{old}$ cannot be obtained (e.g., when the old device does not have a function for providing the total erasure count 665 or the like), $E_{new}$ cannot be obtained with the above Expression 7. Accordingly, $E_{old}$ is replaced with other information (the write amount and physical capacity) by using the following Expression 8.

[Formula 8]

$$E_{old} = \frac{WR_{old} \times WAF_{old}}{CP_{old}} \quad (8)$$

In storage devices that use flash memory, since there is a characteristic that rewriting cannot be performed unless an erasure process is performed on the block (page) that had been written to, when the storage device receives write data from the DKC 10, writing is always performed on an unwritten (erased) page, and when there are no unwritten (erased) pages, a process is repeated of generating erased pages by deleting those blocks that contain unused pages. For example, in a case that data of (n×b) blocks is written in the storage device with respect to a storage device having a physical capacity of b blocks (where n is a sufficiently large number with respect to b), (n−1) erasure operations are performed. That is, this means that when n is sufficiently large, the erasure count is substantially equal to:

(amount of writes that occurred in the storage device÷physical capacity)

(for this reason, as described above, when the physical capacity is large, the erasure count decreases). Accordingly, it can be assumed that a relationship like that of Expression 8 above generally holds between $E_{old}$, $CP_{old}$, $WR_{old}$, and $WAF_{old}$.

Then, using the relationship of Expression 8, Expression 7 can be expressed as the following Expression 9.

[Formula 9]

$$E_{new} = \frac{WR_{old} \times WAF_{old}}{CP_{old}} \times \frac{WAF_{new}}{WAF_{old}} \times \frac{WR_{new}}{WR_{old}} \times \frac{CP_{old}}{CP_{new}} \quad (9)$$
$$= \frac{WR_{old} \times WAF_{new}}{CP_{new}} \times \frac{WR_{new}}{WR_{old}}$$

However, $WR_{new}$ is an unknown value immediately after replacement. Accordingly, in the storage apparatus according to Embodiment 3, $WR_{new}$ is estimated from another value. In Embodiment 3, the following cases 1 and 2 are assumed as the estimation methods of $WR_{new}$.

(Case 1) The amount of writes per unit time for the old device is the same as the amount of writes per unit time for the new device (assume that $WR_{new}=WR_{old}$).

(Case 2) The amount of writes per unit time for the new device is proportional to the ratio ($CL_{new} \div CL_{old}$) of the logical capacity of the new device and the logical capacity of the old device (estimation is performed based on the following Expression (10)).

Case 1 is an estimation method of $WR_{new}$ based on the assumption that the access tendency from the DKC 10 to the storage device does not fluctuate as a result of simply replacing the storage device. In this case, $E_{new}$ is calculated with the following Expression 9' (Expression 9' is an expression of the case when $WR_{new}=WR_{old}$ in Expression (9)).

[Formula 10]

$$E_{new} = \frac{WR_{old} \times WAF_{new}}{CP_{new}} \quad (9')$$

In contrast, Case 2 may occur, for example, in a case in which the storage apparatus 1 has different types of storage devices (for example, SSDs and HDDs), and a storage hierarchy is constructed using multiple types of storage devices. In the case that the old device is a device positioned in the upper layer in the storage hierarchy and the sum of the amounts of the storage regions positioned in the upper layer is smaller than the storage capacity that the storage apparatus 1 provides to the host 2 (generally, since the storage capacity of the lower layer is larger than the storage capacity of the upper layer, this relation holds), unless the storage apparatus 1 deliberately restricts usage of the storage regions of the upper level, the storage region of the upper layer is preferentially used, and as a result, writing is performed to the majority (almost 100%) of the regions.

Therefore, it is estimated that the larger the logical capacity of the new device is with respect to the logical capacity of the old device, the greater the amount of writes to the new device will be. That is, it can be considered that the relationship of the following Expression 10 generally holds between the write amount and the logical capacity.

[Formula 11]

$$\frac{WR_{new}}{WR_{old}} = \frac{CL_{new}}{CL_{old}} \quad (10)$$

Using Expression 10, the above Expression 9 can be expressed as the following Expression 9".

[Formula 12]

$$E_{new} = \frac{WR_{old} \times WAF_{new}}{CP_{new}} \times \frac{CL_{new}}{CL_{old}} \quad (9")$$

The storage apparatus 1 (DKC 10) according to Embodiment 3 calculates the erasure count per unit time of the new device using the above Expression 9' or Expression 9". In addition, since $WAF_{old}$ and $E_{old}$ of the old device are not included in Expression 9' or Expression 9," Enew can be calculated even in cases where the old device is not a storage device that uses flash memory (for example, in the case of an HDD).

However, when using Expression 9' or Expression 9", it is necessary to obtain $WAF_{new}$ in advance. It is generally known that WAF is a value that depends on the spare area ratio of the storage device (a value obtained by taking "logical capacity÷physical capacity"), the random write ratio, the compression ratio, and the like. In Embodiment 3, the spare area ratio of the new device, and the random write ratio and compression ratio of the old device are input to the DKC 10, and a function (referred to as a WAF calculation function) for outputting WAF is provided (in particular, the WAF calculation function is implemented in the program executed by the DKC 10). When calculating the erasure count per unit time of the new device using Expression 9' or Expression 9", the DKC 10 calculates $WAF_{new}$ using the WAF calculation function. However, as another embodiment, when the storage apparatus 1 calculates the erasure count per unit time of the new device using Equation 9' or Equation 9", the erasure count per unit time of the new device may be calculated with $WAF_{new}$ considered to be a predetermined constant (an actual measurement value of WAF obtained from experiments performed in advance using the new device may be used as this constant, for example).

Figure 22:
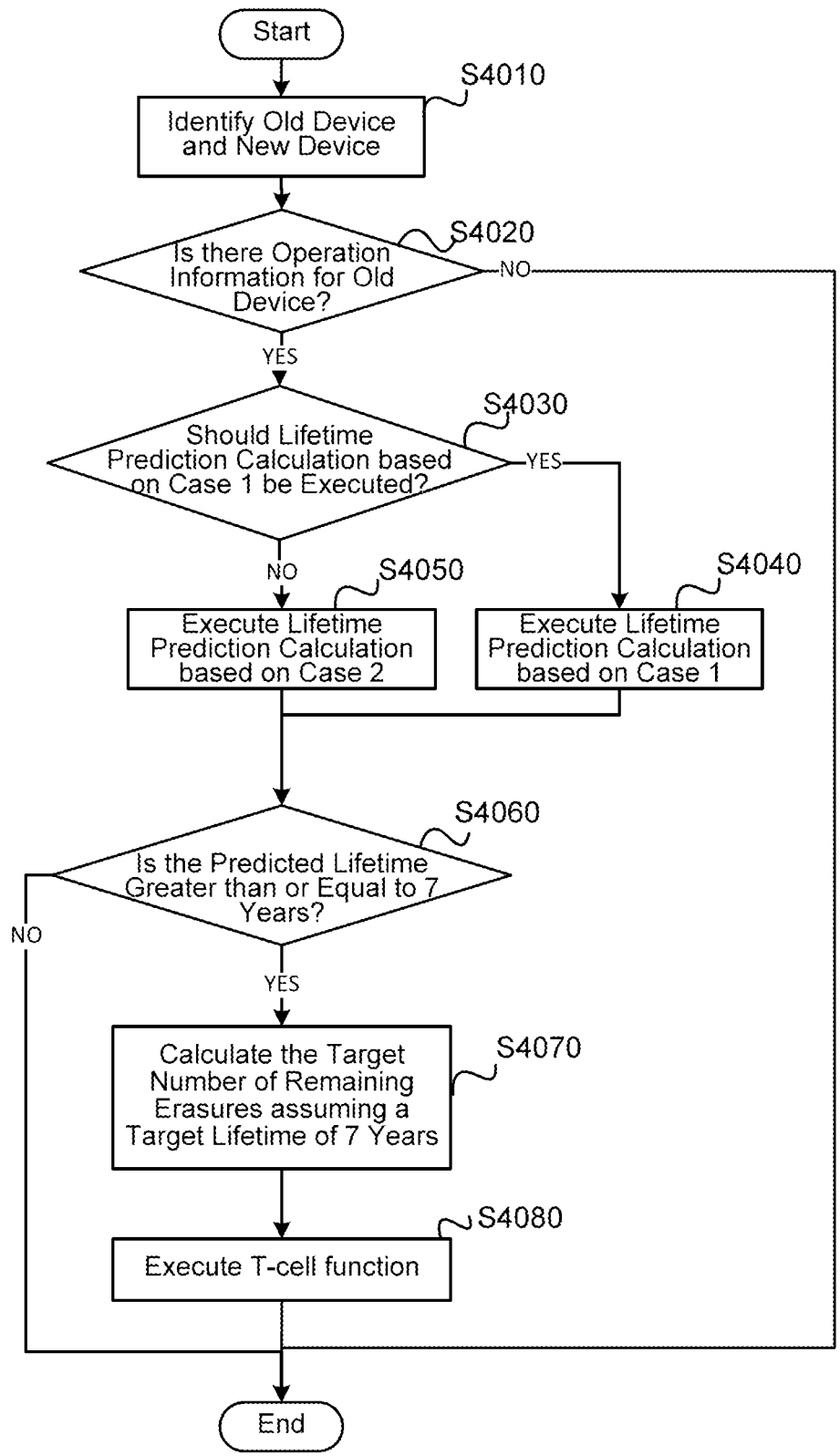
FIG. 22 is a flowchart of a logical capacity expansion process according to Embodiment 3.

Subsequently, with reference to FIG. 22, the flow of the logical capacity expansion processing of the new device in the storage apparatus 1 according to Embodiment 3 will be described. This process is initiated after a user (the administrator of the storage apparatus 1) installs the new device in the storage apparatus 1. In addition, most of the processing in FIG. 22 is performed primarily by the CPU 11 of the storage controller 10 executing a capacity expansion program (not illustrated in the Figures) stored in the memory 14. Also, in the following description, an example will be described in which the target lifetime value of the new device is seven years from the present point in time. However, the target lifetime value of the new device is does not necessarily have to be seven years from the present point in time.

Step 4010: The user uses the management host 5 to designate the old device and the new device. Note that it is assumed that the management host 5 is configured to be capable of providing some sort of graphical user interface (GUI) to the user such that the user can designate the old device and the new device. As an example, it is sufficient for the GUI provided by the management host 5 to display a list of the storage devices mounted in the storage apparatus 1 on the screen of the management host 5 such that the user can designate the old device and the new device from among the displayed storage devices using an input device such as a mouse. When the user designates the old device and the new device using such a GUI, that information is transmitted to the DKC 10, and the DKC 10 can recognize the storage devices (the old device and the new device) to be replaced. It should be noted that, in the present embodiment, it is assumed that the information regarding the logical capacity is acquired from the storage device and recorded in the RAID group management table 650 when the storage device (for example, the new device) is mounted in the storage device 1. Also, in the case that the storage device has a function capable of notifying the storage controller 10 of the physical capacity, information on the physical capacity is also acquired from the storage device and recorded in the RAID group management table 650.

Step 4020: The capacity expansion program refers to the RAID group management table 650' and determines whether operation information for the old device exists. As described above, the capacity expansion program obtains the erasure count per unit time using the above-described Expression 9 (or Expression 9' or Expression 9"). In order to obtain the erasure count per unit time, the total write amount and the operation time are necessary. In addition, in order to obtain the WAF of the new device, the random write ratio and the data compression ratio are required. Accordingly, here, the capacity expansion program determines whether these pieces of information are stored in the RAID group management table 650' as the operation information for the old device. As a case in which these pieces of information are not stored, for example, there could be a case in which the old device does not have a function for providing the DKC 10 with this information (for example, the data compression ratio), and so the DKC 10 was unable to acquire it.

In the case that the operation information for the old device is not stored in the RAID group management table 650' (Step 4020: NO), the processing is terminated. In this case, logical capacity expansion of the new device is not performed at the time of installation. However, the logical capacity expansion may be performed at a later date using the processing described in Embodiment 1. When the operation information for the old device is stored in the RAID group management table 650' (Step 4020: YES), Step 4030 is then performed:

Step 4030: In this example, the user designates, using the management host 5, which of either of the assumptions of the above-described Case 1 or Case 2 on which the calculation of the target number of remaining erasures should be based. In the case that the target number of remaining erasures is calculated based on the assumption of Case 1 (Step 4030: YES), then Step 4040 is subsequently performed, and in the case that the target number of remaining erasures is calculated based on the assumption of Case 2 (Step 4030: NO), then Step 4050 is subsequently performed.

However, as another embodiment, in the case that the DKC 10 possesses information regarding the access tendency or purpose of the old device, it may be automatically determined which of the assumptions of Case 1 or Case 2 should be used by the capacity expansion program to calculate the target number of remaining erasures. For example, in the storage apparatus 1, when a storage hierarchy is constructed using a plurality of types of storage devices, the DKC 10 possesses information regarding the storage hierarchy to which the old device belongs. In the case that the DKC 10 possesses information regarding the storage hierarchy to which each device belongs, it is preferable for the capacity expansion program to use this to specify the storage hierarchy to which the old device belongs. Also, in the case that the old device is operated as a storage device positioned in the highest layer, it is preferable for the capacity expansion program to determine to calculate the target number of remaining erasures based on the assumption of Case 2.

Step 4040: The capacity expansion program calculates the predicted lifetime value of the new device based on the assumption of Case 1. As the details of the calculation method have been described above, only the outline thereof will be described here. First, the capacity expansion program calculates a predicted value ($E_{new}$) of the erasure count per unit time of the new device using Expression 9'. As can be understood from Expression 9', the logical capacities of the old device and the new device, the write amount per unit time of the old device, the physical capacity of the new device, and the WAF of the new device are necessary for calculation of ($E_{new}$), but the DKC 10 derives these pieces of information from the information stored in the RAID group management table 650'. For example, the write amount per unit time of the old device can be derived by dividing the total write amount 663 of the old device, by the operation time of the old device (the difference between the current time and the start date 656).

It should be noted that, since the relationship Ga=$-E_{new}$ exists between $E_{new}$ and Ga (the rate of change in the number of remaining erasures), when the above-mentioned Expression 5 is rewritten as an expression using $E_{new}$, it becomes the following.

[Formula 13]

$$Ta = \frac{Na}{E_{new}} + T0 \qquad (5')$$

The capacity expansion program calculates the predicted lifetime value using this Expression 5'.

Step 4050: The capacity expansion program calculates the predicted lifetime value of the new device based on the assumption of Case 2. The calculation method is the same as that in Step 4040 (the only difference is that Expression 9" is used for the calculation of $E_{new}$).

Step 4060: In the case that the predicted lifespan value obtained in Step 4040 or Step 4050 is 7 years or more from the present point in time (Step 4060: YES), then Step 4070 is performed next, and otherwise (Step 4060: NO), the processing ends here and the logical capacity is not expanded.

Step 4070: The capacity expansion program calculates, using Expression 6 described above, the number of remaining erasures (the target number of remaining erasures) in the case that the target lifetime value were to be set to seven years from the present point in time.

Step 4080: The capacity expansion program performs cell mode modification processing using the target number of remaining erasures obtained in Step 4070. In this case, the DKC 10 may perform the same operation as described in Step 6 of Embodiment 1.

First, the capacity expansion program issues a capacity verification command to the new device (SSD 21) (the processing of Step S7 in FIG. 13), and in response to this, the new device returns the logical capacity in the case that the block 211 were to be changed to the TLC mode (Step 8). Subsequently, the capacity expansion program issues, to the new device, a cell mode modification command that includes the logical capacity returned from the new device (Step 13). In response, the new device changes the cell mode of a portion of the blocks of the new device from the MLC mode to the TLC mode.

When the cell mode modification processing is completed, the expansion of the logical capacity of the storage device is completed. Subsequently, once the user moves the data from the old device to the new device, the replacement process is completed. In the case that the storage apparatus 1 has a data migration function, this data migration may be used, or alternatively, the host 2 may cause the host 2 to read the data of the old device, and the read data may be written from the host 2 to the new device.

In the storage apparatus 1 according to Embodiment 3, by performing the above processing, the logical capacity of the SSD 21 can be expanded immediately.

It should be noted that, in order to prevent the explanation from becoming complicated, an example of replacing one storage device was described. In practice, however, replacement of a plurality of storage devices may be performed. For example, as described above, since the storage apparatus 1 constructs the RAID group with a plurality of storage devices, replacement is often performed on a RAID group basis, as well. Accordingly, when the above-described logical capacity expansion processing is performed, the processing of FIG. 22 may be performed for all of the storage devices that constitute the RAID group. Further, in this case, based on the results of the calculation of the predicted lifetime value in Step 4040 (or Step 4050) in FIG. 22, in the case that the predicted lifetime values are different for each storage device that constitute the RAID group, the capacity expansion program obtains the target number of remaining erasures for the storage device having the shortest predicted lifetime value (Step 4070). Then, when changing the cell mode of each storage device (Step 4080), it is desirable to change the cell mode based on the target number of remaining erasures obtained for the storage device with the shortest predicted lifetime value.

Although the embodiments of the present invention have been described above, these are examples given for the purpose of explaining the present invention, and the scope of the present invention is not limited to these examples. That is, the invention can be implemented in a variety of other forms.

In the embodiments described above, an example was described in which each cell of the SSD 21 can store 2-bit data or 3-bit data, but the present invention is not limited thereto. For example, the present invention can also be applied to a case in which each cell of the SSD 21 can be changed from a mode capable of storing n-bits of data (where n is an integer of 2 or more) to a mode capable of storing data of m-bits (where m is an integer satisfying n<m) (or vice versa). Also, in the above embodiments, although an example was described in which, when the cell mode of a block is modified from the MLC mode to the TLC mode, the number of remaining erasures of the block is changed to 1/c (for example, c=10) of the number of remaining erasures before the cell mode change, this is merely an example, and other examples may be utilized.

Further, in the embodiments described above, an example was described in which the storage system operates a plurality of SSDs 21 as a RAID group; however, the SSDs 21 are not limited to a configuration in which they need be operated as a RAID group. For example, the storage system may register and operate a storage address space provided by the single SSD 21 in a pool, or the storage address space provided by the SSD 21 may be directly provided to the host 2.

Also, in the embodiments described above, the SSD 21 may receive the capacity verification command from the storage controller 10 such that, when the number of remaining erasures (target number of remaining erasures) is acquired, the calculated capacity information may be returned to the storage controller 10. When the capacity information (included in the cell mode modification command) is received from the storage controller 10, the mode of a portion of the cells (blocks) may be changed from the MLC mode to the TLC mode based on the capacity information. That is, two commands are exchanged between the storage controller 10 and the SSD 21 before the cell mode is changed. However, as another embodiment, the SSD 21 may change the cell mode without returning a response to the storage controller 10 when the target number of remaining erasures is provided by the storage controller 10. More particularly, for example, in the processing up to Step 2070 in FIG. 11, blocks that may be changed to the TLC mode may be determined, such that the SSD 21 may change the blocks determined in Step 2080 to the TLC mode.

Also, in the embodiments described above, although the number of remaining erasures was utilized to estimate the remaining lifetime of the cell after changing the mode, the method of estimating the remaining life is not limited to this method. As an example, it is known that the lifetime of a cell depends not only on the number of erasures, but also on the erasure interval (the time elapsed from the previous erasure). Accordingly, in place of the number of remaining erasures, a point taking into account the erasure interval may be managed, and the remaining service life may be calculated (estimated) based on the rate of change of this point (For example, rather than the number of remaining erasures, a fixed point may be initially provided to all the blocks. When a block is erased, the value of a predetermined amount is reduced from the block based on the erasure interval, but when the erasure interval is short, the amount to be reduced may be increased). In this way, it is conceivable that the remaining service life may be estimated more, accurately.

Further, in Embodiment 3, when the storage apparatus calculates the predicted lifetime value and the target number of remaining erasures of the new device, instead of using the erasure count per unit time of the old device, an example of using the write amount per unit time (for example, using Expression 9'), was described. However, as another embodiment, in the case that the erasure count or the WAF of the old device can be obtained (in the case that the old device has a function for providing information on the erasure count and the WAF to the storage controller) the storage controller may store the information acquired from the old device in the total erasure count 665 or the WAF 666 of the RAID group management table, and calculate the predicted lifetime value and the target number of remaining erasures of the new device using these pieces of information.

Also, in Embodiment 3, although an example was described in which the storage apparatus (the capacity expansion program) calculates the predicted lifetime value and the target number of remaining erasures of the new device, these processes do not necessarily need to be performed by the storage apparatus. For example, the management host 5 may execute a program similar to the capacity expansion program described above. In this case, the management host 5 acquires the RAID group management table 650' from the storage controller 10, and the management host 5 calculates the predicted lifetime value of the new device and the target number of remaining erasures. Subsequently, based on the calculated value, the management host 5 may cause the storage controller 10 to change the cell mode of a portion of the blocks of the new device.

Alternatively, by installing and executing the capacity expansion program described above on a general-purpose computer such as a personal computer (hereinafter referred to as a "PC"), a PC may be made to calculate the predicted lifetime value and the target number of remaining erasures of the new device. At this time, an operator such as a maintenance worker of the storage apparatus 1 preferably acquires the RAID group management table 650' from the storage controller 10 in advance using the management host 5 and stores it on the PC. Furthermore, by connecting the new device to this PC and issuing a cell mode modification command from the PC to the new device, the cell mode of (a plurality of blocks of) the new device may be changed prior to installing the new device in the storage apparatus 1. In this way, when installing the new device in the storage apparatus 1, since it is unnecessary to execute the capacity expansion program in the storage apparatus 1, the new device can be quickly installed in the storage apparatus 1.

REFERENCE SIGNS LIST

1 Storage Apparatus
2 Host Computer
3 SAN
5 Management Host
10 Storage Controller
11 CPU
12 Host I/F
13 Device I/F
14 Memory
15 Management I/F
21 SSD
25 HDD
200 SSD Controller
201 CPU
202 Upstream I/F
203 Downstream I/F
204 Memory
205 Internal Connection Switch
210 FM Chip
211 Block
213 Die
214 Cell

What is claimed is:

1. A storage system comprising:
a storage controller and a plurality of storage devices connected to the storage controller;
the plurality of storage devices including:
a device controller, and
a nonvolatile storage medium having a plurality of blocks as data erase units, the plurality of blocks including a plurality of cells;
wherein
each block of the plurality of blocks is configured to operate the cells in the block in either a first mode capable of storing n-bit information or a second mode capable of storing m-bit information (n<m), wherein n is an integer of 2 or more and m is an integer of 3 or more;

the device controller is configured to:
  manage a number of remaining erasures for each block,
  reduce, when a mode of the block is changed from the first mode to the second mode, the number of remaining erasures of the block, and
  increase, when a mode of the block is changed from the second mode to the first mode, the number of remaining erasures of the block; and
the storage controller is configured to:
  acquire, from the plurality of storage devices, the number of remaining erasures of the plurality of storage devices,
  calculate a rate of change of the number of remaining erasures of the plurality of storage devices,
  calculate, using the rate of change of the number of remaining erasures of the plurality of storage devices, a predicted lifetime value for the plurality of storage devices, and
  change, when the predicted lifetime value is less than a target lifetime, the mode of a predetermined number of the blocks operating in the second mode to the first mode.

2. The storage system according to claim 1, wherein:
the predetermined number is a number of the blocks required for the storage device to satisfy the target lifetime.

3. The storage system according to claim 2, wherein:
the storage controller is configured to calculate, using the rate of change of the number of remaining erasures of the plurality of storage devices, a target number of remaining erasures that; indicates a number of remaining erasures of the plurality of storage devices that can achieve the target lifetime.

4. The storage system according to claim 3, wherein:
the storage controller is configured to notify the plurality of storage devices of the target number of remaining erasures; and
the plurality of storage devices are configured to calculate a post-mode change storage capacity, which is a storage capacity of the plurality of storage devices when a number of the blocks that are operating in the second mode and that are necessary for the number of remaining erasures of the plurality of storage devices to exceed the target number of remaining erasures are changed to the first mode.

5. The storage system according to claim 4, wherein:
the storage system structures a plurality of RAID groups from the plurality of storage devices; and
the storage controller is configured to:
  acquire the post-mode change storage capacity calculated by each of the storage devices belonging to the plurality of RAID groups, and
  notify each of the storage devices belonging to the plurality of RAID groups of a minimum value of the acquired post-mode change storage capacity of each of the storage devices, and
the storage device that received the notification is configured to repeat, until the storage capacity reaches the notified minimum value, a process of changing the mode of the blocks operating in the second mode to the first mode.

6. The storage system according to claim 5, wherein:
modification permissions for an amount of information storable in the plurality of blocks can be set for each RAID group; and
the storage controller is configured to only change the mode of the blocks of storage devices that belong to RAID groups for which the mode of the blocks is set to be able to be modified.

7. The storage system according to claim 1, wherein:
when replacing a designated storage device of the plurality of storage devices with a new device, which is a storage device newly used in the storage system;
the storage controller is configured to:
  calculate, using operation information of the designated storage device and information regarding the capacity of the new device, an erasure count per unit time prediction value for the new device,
  calculate, using the erasure count per unit time prediction value for the new device, a predicted lifetime value of the new device, and
  increasing a storage capacity of the new device by changing, from among the blocks in the first mode of the new device, the mode of a predetermined number of blocks to the second mode when the predicted lifetime value is greater than a predetermined value.

8. A storage device connected to a storage controller, the storage device comprising:
  a device controller, and
  a nonvolatile storage medium having a plurality of blocks as data erase units, the plurality of blocks including a plurality of cells,
wherein
  each block of the plurality of blocks is configured to change the cells in the block from a state of operating in a first mode capable of storing n-bit information to a second mode capable of storing m-bit information (n<m), wherein n is an integer of 2 or more and m is an integer of 3 or more; and
  the device controller is configured to:
    manage a number of remaining erasures for each block;
    increase, when the mode of the block is changed from the second mode to the first mode, the number of remaining erasures of the block, and
    when a target number of remaining erasures received from the storage controller is greater than or equal to the number of remaining erasures of the storage device,
    identify, based on the target number of remaining erasures, a number of blocks that need to be changed to the first mode from among the blocks operating in the second mode; and
    return, to the storage controller, a storage capacity of the storage device for a case in which the identified blocks were to be changed to the first mode.

9. The storage device according to claim 8, wherein:
the device controller is configured to identify, as blocks that need to be changed to the first mode, a number of blocks that are necessary for the number of remaining erasures of the plurality of storage devices to exceed the target number of remaining erasures.

10. The storage device according to claim 9, wherein:
the device controller is configured to repeat, in response to receiving a cell mode modification command from the storage controller, a process of changing the blocks operating in the second mode to the first mode within a range in which the storage capacity of the plurality of storage devices does not fall below a capacity included in the cell mode modification command.

11. The storage device according to claim 9, wherein:
the device controller is configured to preferentially change, from among the blocks operating in the second mode, blocks to the first mode starting with blocks having a fewer number of remaining erasures.

12. The storage device according to claim 9, wherein:
the device controller is configured to return, in response to receiving an acquisition request for the number of remaining erasures from the storage controller, a total of the number of remaining erasures for each block as the number of remaining erasures of the storage device to the storage controller.

13. A method for controlling a storage system, the storage system including:
   a storage controller and a plurality of storage devices connected to the storage controller;
   the plurality of storage devices including:
      a device controller, and
      a nonvolatile storage medium having a plurality of blocks as data erase units, the plurality of blocks including a plurality of cells,
wherein
   each block of the plurality of blocks is configured to operate the cells in the block in either a first mode capable of storing n-bit information or a second mode capable of storing m-bit information (n<m), wherein n is an integer of 2 or more and m is an integer of 3 or more;

the device controller is configured to:
   manage a number of remaining erasures for each block;
   reduce, when a mode of the block is changed from the first mode to the second mode, the number of remaining erasures of the block, and
   increase, when a mode of the block is changed from the second mode to the first mode, the number of remaining erasures of the block; and
the storage controller is configured to execute a method for controlling the storage system comprising:
   1) acquiring, from the plurality of storage devices, the number of remaining erasures of the plurality of storage devices and calculating a rate of change of the number of remaining block erasures of the plurality of storage devices,
   2) calculating, using the rate of change of the number of remaining erasures of the plurality of storage devices, a predicted lifetime value for the plurality of storage devices, and
   3) changing, when the predicted lifetime value is less than a target lifetime, the mode of a predetermined number of the blocks operating in the second mode to the first mode.

* * * * *